US012119804B2

United States Patent
Yamane et al.

(10) Patent No.: US 12,119,804 B2
(45) Date of Patent: Oct. 15, 2024

(54) ACOUSTIC WAVE DEVICE

(71) Applicant: Murata Manufacturing Co., Ltd., Nagaokakyo (JP)

(72) Inventors: Takashi Yamane, Nagaokakyo (JP); Sho Nagatomo, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 336 days.

(21) Appl. No.: 17/701,985

(22) Filed: Mar. 23, 2022

(65) Prior Publication Data

US 2022/0216845 A1 Jul. 7, 2022

Related U.S. Application Data

(63) Continuation of application No. PCT/JP2020/036397, filed on Sep. 25, 2020.

(30) Foreign Application Priority Data

Sep. 27, 2019 (JP) ................. 2019-178100

(51) Int. Cl.
*H03H 9/02* (2006.01)
*H03H 9/13* (2006.01)
*H03H 9/205* (2006.01)

(52) U.S. Cl.
CPC .... *H03H 9/02157* (2013.01); *H03H 9/02015* (2013.01); *H03H 9/0211* (2013.01); *H03H 9/13* (2013.01); *H03H 9/205* (2013.01)

(58) Field of Classification Search
CPC .......... H03H 9/02157; H03H 9/02015; H03H 9/0211; H03H 9/13; H03H 9/205
See application file for complete search history.

(56) References Cited

U.S. PATENT DOCUMENTS

| 2010/0223999 | A1 | 9/2010 | Onoe |
| 2011/0109196 | A1* | 5/2011 | Goto ................. H03H 9/02228 310/313 C |
| 2013/0057360 | A1* | 3/2013 | Meltaus ................ H03H 9/564 29/25.35 |

(Continued)

FOREIGN PATENT DOCUMENTS

| JP | 2010-233210 A | 10/2010 |
| JP | 2012-257019 A | 12/2012 |

(Continued)

OTHER PUBLICATIONS

Official Communication issued in International Patent Application No. PCT/JP2020/036397 mailed on Dec. 15, 2020.

*Primary Examiner* — Samuel S Outten
(74) *Attorney, Agent, or Firm* — Keating & Bennett, LLP

(57) ABSTRACT

An acoustic wave device includes a piezoelectric layer, a first electrode, a second electrode, a first divided resonator, a second divided resonator, and a support substrate. The support substrate includes first and second energy confinement layers. The first energy confinement layer at least partially overlaps with a first region of the piezoelectric layer. The second energy confinement layer at least partially overlaps with a second region of the piezoelectric layer. The first and second energy confinement layers are integrally provided in the support substrate.

19 Claims, 21 Drawing Sheets

(56) References Cited

U.S. PATENT DOCUMENTS

| | | | |
|---|---|---|---|
| 2016/0049920 A1* | 2/2016 | Kishino | H03H 9/725 |
| | | | 343/858 |
| 2016/0118956 A1 | 4/2016 | Kihara et al. | |
| 2017/0187352 A1 | 6/2017 | Omura | |
| 2017/0373663 A1 | 12/2017 | Kishimoto et al. | |
| 2019/0149129 A1* | 5/2019 | Ueda | H03H 3/10 |
| | | | 333/186 |
| 2019/0149312 A1 | 5/2019 | Takimine | |
| 2020/0220518 A1 | 7/2020 | Omura | |

FOREIGN PATENT DOCUMENTS

| | | |
|---|---|---|
| JP | 2013-528996 A | 7/2013 |
| JP | 2018-007239 A | 1/2018 |
| JP | 2019-092096 A | 6/2019 |
| WO | 2015/002047 A1 | 1/2015 |
| WO | 2016/052129 A1 | 4/2016 |
| WO | 2016/129662 A1 | 8/2016 |
| WO | 2018/003297 A1 | 1/2018 |
| WO | 2019/065666 A1 | 4/2019 |

* cited by examiner

ACOUSTIC WAVE DEVICE

CROSS REFERENCE TO RELATED APPLICATIONS

This application claims the benefit of priority to Japanese Patent Application No. 2019-178100 filed on Sep. 27, 2019 and is a Continuation Application of PCT Application No. PCT/JP2020/036397 filed on Sep. 25, 2020. The entire contents of each application are hereby incorporated herein by reference.

BACKGROUND OF THE INVENTION

1. Field of the Invention

The present invention generally relates to an acoustic wave device, and more particularly to an acoustic wave device including a piezoelectric layer.

2. Description of the Related Art

There has been known an acoustic wave device using a plate wave propagating through a piezoelectric film made of LiNbO$_3$ or LiTaO$_3$. For example, Japanese Unexamined Patent Application Publication No. 2012-257019 discloses an acoustic wave device using a Lamb wave as the plate wave. Here, an IDT electrode is provided on an upper surface of a piezoelectric substrate made of LiNbO$_3$ or LiTaO$_3$. A voltage is applied between multiple first electrode fingers and multiple second electrode fingers of the IDT electrode. Thus, a Lamb wave is excited. Each side of the IDT electrode is provided with one reflector. Thus, an acoustic wave resonator using a plate wave is formed.

SUMMARY OF THE INVENTION

With respect to the acoustic wave device described in Japanese Unexamined Patent Application Publication No. 2012-257019, it is conceivable to decrease the number of first electrode fingers and second electrode fingers in order to reduce the size thereof. However, when the number of first electrode fingers and second electrode fingers is decreased, a Q factor decreases. Further, since a support body 10 has a wall portion, it is hard to reduce in size.

Preferred embodiments of the present invention provide acoustic wave devices each capable of increasing a Q factor and maintaining strength even when the size thereof is further reduced.

An acoustic wave device according to an aspect of a preferred embodiment of the present invention includes a piezoelectric layer, a first electrode, and a second electrode. The first electrode and the second electrode face each other in a direction intersecting with a thickness direction of the piezoelectric layer. The acoustic wave device uses a thickness shear primary mode bulk wave. A material of the piezoelectric layer is lithium niobate or lithium tantalate. The acoustic wave device includes multiple electrode portions including the first electrode and the second electrode. The acoustic wave device further includes a first divided resonator, a second divided resonator, and a support substrate. The first divided resonator and the second divided resonator are connected in series without another resonator being connected therebetween, or are connected in parallel with each other to the same connection node on a path connecting an input terminal and an output terminal. The support substrate includes a first main surface and a second main surface opposed to each other. The first divided resonator includes a first installation portion. The first installation portion includes a first electrode portion of the multiple electrode portions and a first region of the piezoelectric layer. The first region is provided with the first electrode portion. The second divided resonator includes a second installation portion. The second installation portion includes a second electrode portion of the multiple electrode portions and a second region of the piezoelectric layer. The second region is provided with the second electrode portion. The piezoelectric layer is directly or indirectly provided on the support substrate. The support substrate includes a first energy confinement layer and a second energy confinement layer. The first energy confinement layer at least partially overlaps with the first region of the piezoelectric layer in a plan view from the thickness direction of the piezoelectric layer. The second energy confinement layer at least partially overlaps with the second region of the piezoelectric layer in a plan view from the thickness direction of the piezoelectric layer. In the support substrate, the first energy confinement layer and the second energy confinement layer are integrally provided.

An acoustic wave device according to an aspect of a preferred embodiment of the present invention includes the piezoelectric layer, the first electrode, and the second electrode. The first electrode and the second electrode face each other in a direction intersecting with a thickness direction of the piezoelectric layer. The first electrode and the second electrode are adjacent to each other. In any section along the thickness direction of the piezoelectric layer, when a distance between center lines of the first electrode and the second electrode is denoted as p and a thickness of the piezoelectric layer is denoted as d, d/p is about 0.5 or less. A material of the piezoelectric layer is lithium niobate or lithium tantalate. The acoustic wave device includes multiple electrode portions including the first electrode and the second electrode. The acoustic wave device further includes a first divided resonator, a second divided resonator, and a support substrate. The first divided resonator and the second divided resonator are connected in series without another resonator being connected therebetween, or are connected in parallel with each other to a same connection node on a path connecting an input terminal and an output terminal. The support substrate includes a first main surface and a second main surface opposed to each other. The first divided resonator includes a first installation portion. The first installation portion includes a first electrode portion of the multiple electrode portions and a first region of the piezoelectric layer. The first region is provided with the first electrode portion. The second divided resonator includes a second installation portion. The second installation portion includes a second electrode portion of the multiple electrode portions and a second region of the piezoelectric layer. The second region is provided with the second electrode portion. The piezoelectric layer is directly or indirectly provided on the support substrate. The support substrate includes a first energy confinement layer and a second energy confinement layer. The first energy confinement layer at least partially overlaps with the first region of the piezoelectric layer in a plan view from the thickness direction of the piezoelectric layer. The second energy confinement layer at least partially overlaps with the second region of the piezoelectric layer in a plan view from the thickness direction of the piezoelectric layer. In the support substrate, the first energy confinement layer and the second energy confinement layer are integrally provided.

With the use of the acoustic wave devices according to the above-described aspects of preferred embodiments of the present invention, the Q factor may be increased even when the size is further reduced, and it is possible to further reduce the size when the first divided resonator and the second divided resonator are formed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

All of FIG. 1, FIG. 2, FIG. 4 to FIG. 9, FIG. 14 to FIG. 20, FIGS. 21A to 21D, and FIGS. 22A to 22C referred to in the following preferred embodiments or the like are schematic diagrams, and ratios of the sizes or the thicknesses of elements or portions in the figures do not necessarily reflect actual dimensional ratios.

Preferred Embodiment 1

Hereinafter, an acoustic wave device 1 according to Preferred Embodiment 1 will be described with reference to FIG. 1 to FIG. 5.

(1) Overall Configuration of Acoustic Wave Device

Figure 1:
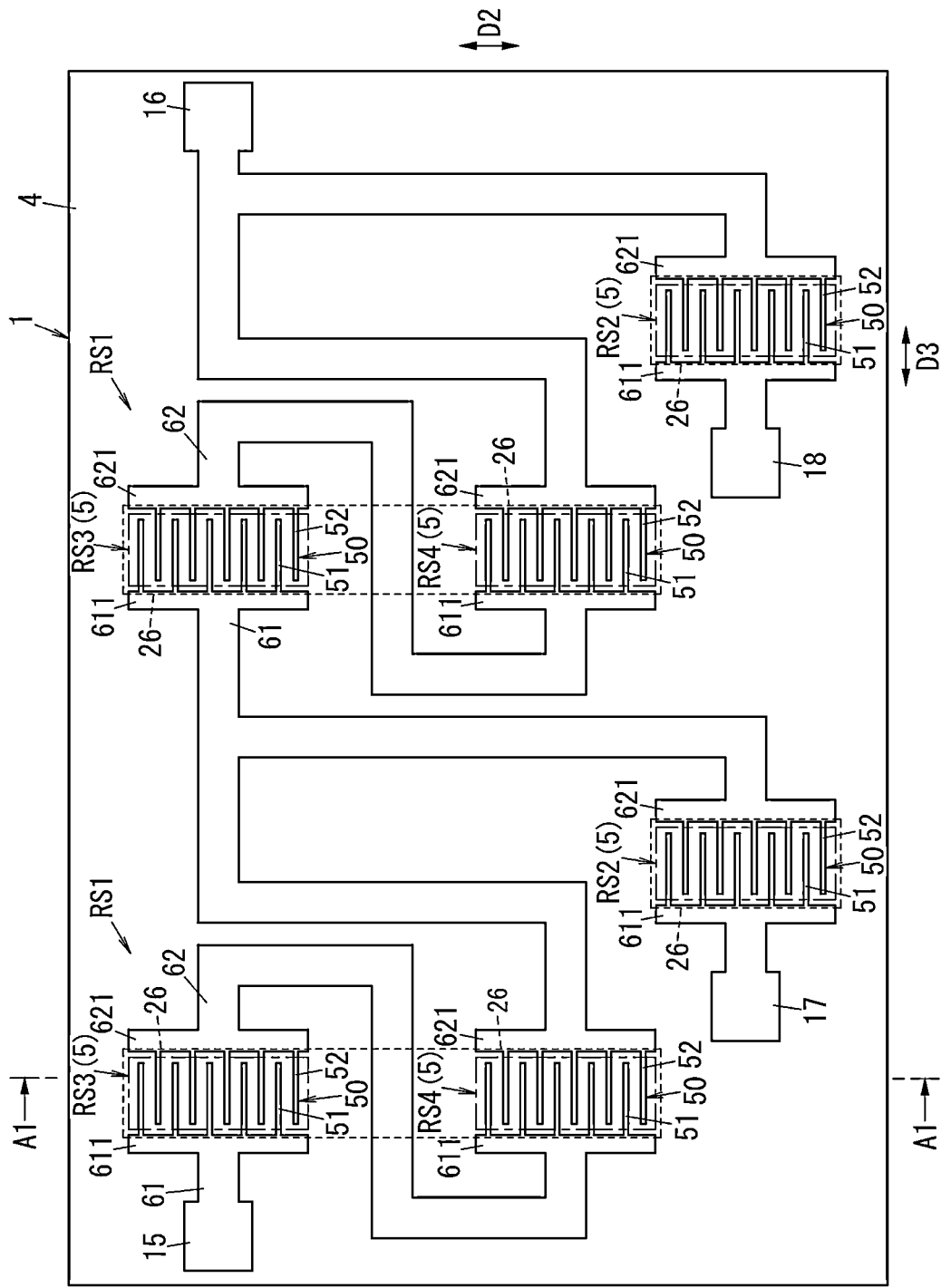
FIG. 1 is a plan view of an acoustic wave device according to Preferred Embodiment 1 of the present invention.
Figure 2:
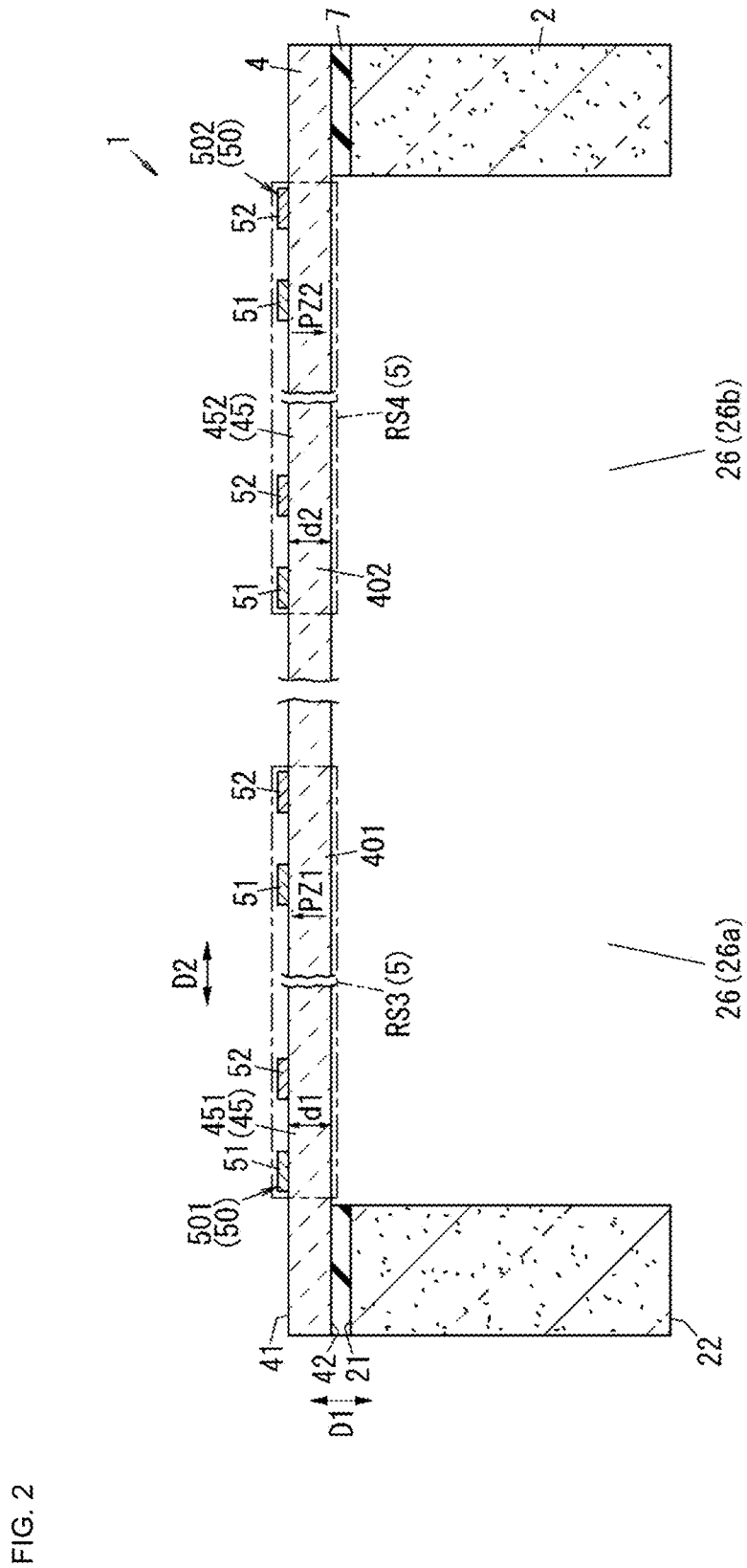
FIG. 2 is a sectional view of the acoustic wave device taken along a line A1-A1 in FIG. 1.

The acoustic wave device 1 according to Preferred Embodiment 1 includes a piezoelectric layer 4, a first electrode 51, and a second electrode 52 as illustrated in FIG. 1. The first electrode 51 and the second electrode 52 face each other in a direction D2 (hereinafter, also referred to as second direction D2) intersecting with a thickness direction (first direction) D1 of the piezoelectric layer 4 as illustrated in FIG. 2. The acoustic wave device 1 uses a thickness shear primary mode bulk wave. The second direction D2 is orthogonal to polarization directions PZ1 and PZ2 of the piezoelectric layer 4. The thickness shear primary mode bulk wave is a bulk wave whose propagation direction is the thickness direction D1 of the piezoelectric layer 4 due to a thickness shear vibration of the piezoelectric layer 4, and in which the number of nodes in the thickness direction D1 of the piezoelectric layer 4 is one. The thickness shear vibration is excited by the first electrode 51 and the second electrode 52. The thickness shear vibration is excited in the defined region 45 between the first electrode 51 and the second electrode 52 in a plan view from the thickness direction D1 in the piezoelectric layer 4. In the acoustic wave device 1, when the second direction D2 is orthogonal to the polarization directions PZ1 and PZ2 of the piezoelectric layer 4, the electromechanical coupling coefficient (hereinafter, also referred to as coupling coefficient) of the thickness shear primary mode bulk wave is large. Here, "orthogonal" is not limited only to a case of being strictly orthogonal, but may be a case of being substantially orthogonal (an angle defined by the second direction D2 and the polarization directions PZ1 and PZ2 is about 90°±10°, for example).

The acoustic wave device 1 includes multiple pairs of the first electrode 51 and the second electrode 52 as illustrated in FIG. 1 and FIG. 2. In the acoustic wave device 1, the multiple first electrodes 51 and the multiple second electrodes 52 are alternately arranged one by one in the second direction D2. The acoustic wave device 1 further includes a first wiring portion 61 connected to the first electrode 51 and a second wiring portion 62 connected to the second electrode 52 as illustrated in FIG. 1. The multiple first electrodes 51 are commonly connected to the first wiring portion 61. The multiple second electrodes 52 are commonly connected to the second wiring portion 62.

The acoustic wave device 1 includes a support substrate 2, the piezoelectric layer 4, the multiple first electrodes 51, and the multiple second electrodes 52 as illustrated in FIG. 2. The piezoelectric layer 4 is provided on the support substrate 2. As an example, the piezoelectric layer 4 is provided on the support substrate 2 via a silicon oxide film 7. The multiple first electrodes 51 and the multiple second electrodes 52 are provided on the piezoelectric layer 4. The acoustic wave device 1 includes an acoustic wave resonator 5 including the first electrode 51, the second electrode 52, and the piezoelectric layer 4, as a resonator. The support substrate 2 includes at least a portion of the cavity 26 that partially exposes the piezoelectric layer 4. The cavity 26 overlaps with the entire acoustic wave resonator 5 in a plan view from the thickness direction D1 of the piezoelectric layer 4. Here, the cavity 26 overlaps with the multiple first electrodes 51, the multiple second electrodes 52, and the multiple defined regions 45 in a plan view from the thickness direction D1 of the piezoelectric layer 4. Each of the multiple defined regions 45 is a portion between the first electrode 51 and the second electrode 52 defining a pair.

Figure 3:
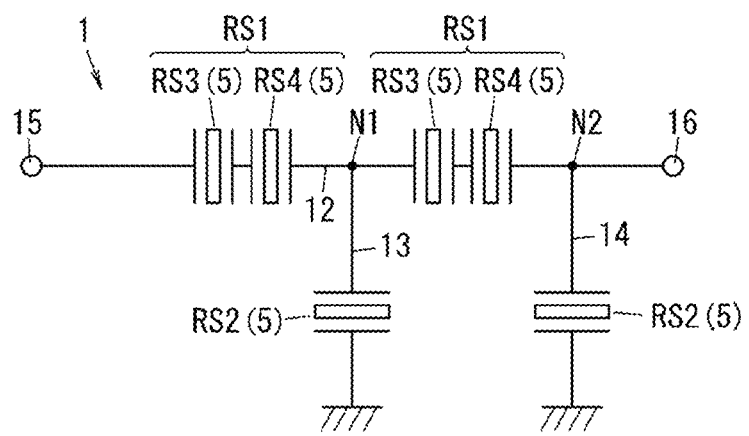
FIG. 3 is an equivalent circuit diagram of the acoustic wave device.

The acoustic wave device 1 according to Preferred Embodiment 1 is an acoustic wave filter (here, a ladder filter) as illustrated in FIG. 1 and FIG. 3. The acoustic wave device 1 includes an input terminal 15, an output terminal 16, multiple (two) series-arm resonators RS1, and multiple (two) parallel-arm resonators RS2. The multiple (two) series-arm resonators RS1 are provided on a first path 12 connecting the input terminal 15 and the output terminal 16. The multiple (two) parallel-arm resonators RS2 are respectively provided one by one on multiple (two) second paths 13 and 14 connecting multiple (two) nodes N1 and N2 on the first path 12 and ground (ground terminals 17 and 18). The ground terminals 17 and 18 may be made common as one ground.

Each of the multiple series-arm resonators RS1 includes the first divided resonator RS3 and the second divided resonator RS4. The first divided resonator RS3 and the second divided resonator RS4 are connected in series. The first divided resonator RS3 and the second divided resonator RS4 (multiple divided resonators) are resonators obtained by dividing the series-arm resonator RS1, and are connected in a line without any of the parallel-arm resonators RS2 being connected therebetween. The number of divided resonators is not limited to two, and may be three or more.

Note that, in each of the multiple series-arm resonators RS1, the first divided resonator RS3 and the second divided resonator RS4 may be connected in parallel. In the case above, the first divided resonator RS3 and the second divided resonator RS4 are connected in parallel with each other to a connection node on the first path 12 connecting the input terminal 15 and the output terminal 16.

Further, each of the multiple parallel-arm resonators RS2 may include a first divided resonator and a second divided resonator. In each of the multiple parallel-arm resonators RS2, the first divided resonator and the second divided resonator are connected in series or in parallel.

In the acoustic wave device 1, each of the first divided resonator RS3, the second divided resonator RS4, and the multiple parallel-arm resonators RS2 is the acoustic wave resonator 5. The first divided resonator RS3 and the second divided resonator RS4 are included in the multiple series-arm resonators RS1. Each of the multiple acoustic wave resonators 5 is a resonator including the multiple first electrodes 51 and the multiple second electrodes 52, but is not limited thereto. It is sufficient that each of the multiple acoustic wave resonators 5 is a resonator including at least a pair of electrodes (first electrode 51 and second electrode 52). In the acoustic wave device 1, the piezoelectric layer 4 is shared by the multiple acoustic wave resonators 5. The resonant frequency of the parallel-arm resonator RS2 is lower than that of the series-arm resonator RS1. Here, whereas the acoustic wave resonator 5 of the parallel-arm resonator RS2 includes a silicon oxide film provided on a first main surface 41 of the piezoelectric layer 4, for example, the acoustic wave resonator 5 of the series-arm resonator RS1 does not include a silicon oxide film on the first main surface 41 of the piezoelectric layer 4. The acoustic wave resonator 5 of the series-arm resonator RS1 may include a silicon oxide film on the first main surface 41 of the piezoelectric layer 4. In the case above, it is required that the thickness of the silicon oxide film of the acoustic wave resonator 5 of the series-arm resonator RS1 is thinner than the thickness of the silicon oxide film of the acoustic wave resonator 5 of the parallel-arm resonator RS2.

(2) Elements of Acoustic Wave Device

Next, elements of the acoustic wave device 1 will be described with reference to the drawings.

(2.1) Support Substrate

The support substrate 2 supports the piezoelectric layer 4 as illustrated in FIG. 2. In the acoustic wave device 1 according to Preferred Embodiment 1, the support substrate 2 supports the piezoelectric layer 4, the multiple first electrodes 51, and the multiple second electrodes 52 via the silicon oxide film 7. Note that, the silicon oxide film 7 is not an essential element. Further, another layer in addition to the silicon oxide film 7 may be laminated between the support substrate 2 and the piezoelectric layer 4.

The support substrate 2 includes a first main surface 21 and a second main surface 22 opposed to each other. The first main surface 21 and the second main surface 22 are opposed to each other in the thickness direction of the support substrate 2. The thickness direction of the support substrate 2 is a direction along the thickness direction D1 of the piezoelectric layer 4. The outer peripheral shape of the support substrate 2 is a rectangular shape in a plan view from the thickness direction D1 of the piezoelectric layer 4, but is not limited thereto, and may be a square shape, for example.

The support substrate 2 is a silicon substrate, for example. The thickness of the support substrate 2 is about 100 μm or more and about 500 μm or less, for example. The support substrate 2 is preferably a single-crystal silicon substrate including a first main surface and a second main surface opposed to each other. When the support substrate 2 is a single-crystal silicon substrate, the plane orientation of the first main surface 21 may be a (100) plane, a (110) plane, or a (111) plane, for example. The propagation orientation of the bulk wave described above may be determined without being restricted by the plane orientation of the single-crystal silicon substrate. The resistivity of the single-crystal silicon substrate is about 1 kΩ·cm or more, for example, but is preferably about 2 kΩ·cm or more, and more preferably about 4 kΩcm or more, for example.

The support substrate 2 is not limited to a silicon substrate, but may be a quartz substrate, a glass substrate, a sapphire substrate, a lithium tantalate substrate, a lithium niobate substrate, an alumina substrate, a spinel substrate, a gallium arsenide substrate, or a silicon carbide substrate, for example.

The support substrate 2 includes at least a portion of the cavity 26 that partially exposes the piezoelectric layer 4. The cavity 26 overlaps with the acoustic wave resonator 5 in a plan view from the thickness direction D1 of the piezoelectric layer 4. In the acoustic wave device 1 according to Preferred Embodiment 1, the cavity 26 is larger than the acoustic wave resonator 5 and overlaps with the entire acoustic wave resonator in a plan view from the thickness direction D1 of the piezoelectric layer 4. Further, in the acoustic wave device 1 according to Preferred Embodiment 1, the cavity 26 also partially overlaps with the first wiring portion 61 and the second wiring portion 62 respectively in a plan view from the thickness direction D1 of the piezoelectric layer 4. The opening shape of the cavity in a plan view from the thickness direction D1 of the piezoelectric layer 4 is a rectangular shape, but is not limited thereto.

(2.2) Silicon Oxide Film

The silicon oxide film 7 is provided between the first main surface 21 of the support substrate 2 and the piezoelectric layer 4. In the acoustic wave device 1 according to Preferred Embodiment 1, the silicon oxide film 7 overlaps with the entire first main surface 21 of the support substrate 2 in the thickness direction D1 of the piezoelectric layer 4. In the acoustic wave device 1 according to Preferred Embodiment 1, the support substrate 2 and the piezoelectric layer 4 are bonded to each other via the silicon oxide film 7. The thickness of the silicon oxide film 7 is about 0.1 µm or more and about 10 µm or less, for example.

(2.3) Piezoelectric Layer

The piezoelectric layer 4 has the first main surface 41 and a second main surface 42 opposed to each other as illustrated in FIG. 2. The first main surface 41 and the second main surface 42 are opposed to each other in the thickness direction D1 of the piezoelectric layer 4. The piezoelectric layer 4 is provided on the first main surface 21 of the support substrate 2. Here, the piezoelectric layer 4 overlaps with the first main surface 21 of the support substrate 2 and the cavity 26 in a plan view from the thickness direction D1. In the piezoelectric layer 4, of the first main surface 41 and the second main surface 42, the first main surface 41 is positioned on the first electrode 51 and the second electrode 52 side, and the second main surface 42 is positioned on the support substrate 2 side. The first main surface 41 of the piezoelectric layer 4 is the main surface of the piezoelectric layer 4 opposite to the support substrate 2 side. The second main surface 42 of the piezoelectric layer 4 is the main surface of the piezoelectric layer 4 on the support substrate 2 side.

In the acoustic wave device 1, the distance between the first main surface 41 of the piezoelectric layer 4 and the support substrate 2 is longer than the distance between the second main surface 42 of the piezoelectric layer 4 and the support substrate 2. The material of the piezoelectric layer 4 is lithium niobate ($LiNbO_3$) or lithium tantalate ($LiTaO_3$). The piezoelectric layer 4 is Z-cut $LiNbO_3$ or Z-cut $LiTaO_3$, for example. With respect to Euler angles ($\varphi$, $\theta$, $\psi$) of the piezoelectric layer 4, $\varphi$ is 0°±10° and $\theta$ is 0°±10°. $\psi$ is an angle of any value. From the viewpoint of increasing the coupling coefficient, the piezoelectric layer 4 is preferably Z-cut $LiNbO_3$ or Z-cut $LiTaO_3$. The piezoelectric layer 4 may be rotated Y-cut $LiNbO_3$, rotated Y-cut $LiTaO_3$, X-cut $LiNbO_3$, or X-cut $LiTaO_3$. The propagation orientation may be a Y-axis direction, an X-axis direction, or a direction rotated within the range of ±90° from the X-axis, in a crystal axis (X, Y, Z) defined to the crystal structure of the piezoelectric layer 4. The piezoelectric layer 4 is a single-crystal, but is not limited thereto, and may be a twin-crystal or ceramics, for example.

The thickness of the piezoelectric layer 4 is about 50 nm or more and about 1000 nm or less, for example, and an example thereof is about 400 nm.

Figure 5:
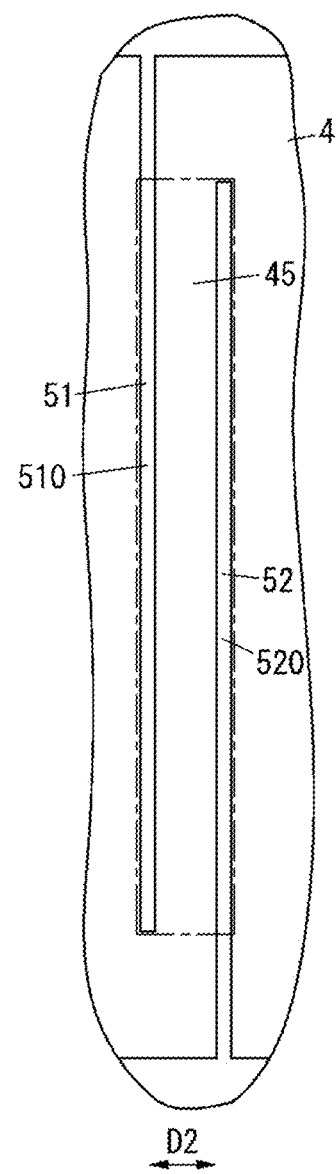
FIG. 5 is a plan view of a main portion of the resonator in the acoustic wave device.

The piezoelectric layer 4 has the defined region 45 (see FIG. 5). In a plan view from the thickness direction D1 of the piezoelectric layer 4, the defined region 45 is the region of the piezoelectric layer 4 that overlaps with both of the first electrode 51 and the second electrode 52 in the direction D2 in which the first electrode 51 and the second electrode 52 face each other, and is positioned between the first electrode 51 and the second electrode 52.

(2.4) Electrode

The multiple first electrodes 51 and the multiple second electrodes 52 are provided on the first main surface 41 of the piezoelectric layer 4.

In the acoustic wave device 1, the first electrode 51 and the second electrode 52 defining a pair have electric potential different from each other. In the acoustic wave device 1, of the first electrode 51 and the second electrode 52 defining a pair, the first electrode 51 is a hot electrode and the second electrode 52 is a ground electrode.

In the acoustic wave device 1, the multiple first electrodes 51 and the multiple second electrodes 52 are alternately arranged one by one to be separated from each other. Accordingly, the first electrode 51 and the second electrode 52 adjacent to each other are separated from each other. The distance between the center lines of the first electrode 51 and the second electrode 52 adjacent to each other is about 1 µm or more and about 10 µm or less, for example, an example thereof is about 3 µm. Here, the first electrode 51 and the second electrode 52 being "adjacent to each other" refers to a case that the first electrode 51 and the second electrode 52 face each other with a gap therebetween. A group of electrodes including the multiple first electrodes 51 and the multiple second electrodes 52 may have a configuration as follows. The multiple first electrodes 51 and the multiple second electrodes 52 are arranged side by side to be separated from each other in the second direction D2, or the multiple first electrodes and the multiple second electrodes 52 are not alternately arranged side by side to be separated from each other. For example, there may be mixed a region in which the first electrode 51 and the second electrode 52 are arranged one by one to be separated from each other, and a region in which two first electrodes 51 or two second electrodes 52 are arranged side by side in the second direction D2.

Figure 4:
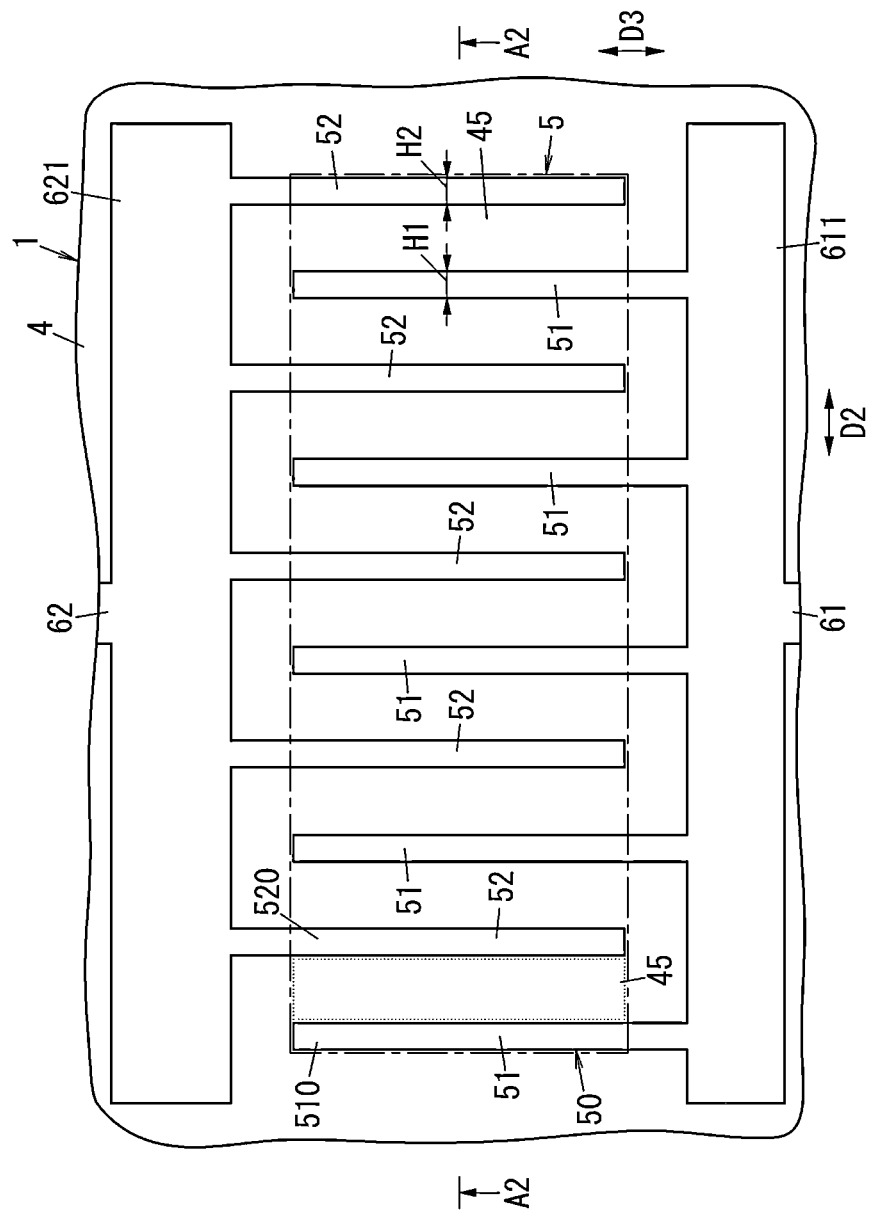
FIG. 4 is a plan view of a resonator included in the acoustic wave device.

In a plan view from the thickness direction D1 of the piezoelectric layer 4, the multiple first electrodes 51 and the multiple second electrodes 52 have an elongated shape (linear shape) with a third direction D3 orthogonal to the second direction D2 as a longitudinal direction and the second direction D2 as a width direction, as illustrated in FIG. 4. The length of each of the multiple first electrodes 51 is about 20 µm, for example, but is not limited thereto. A width H1 (first electrode width H1) of each of the multiple first electrodes 51 is in the range from about 50 nm to about 1000 nm, for example, and an example thereof is about 500 nm. The length of each of the multiple second electrodes 52 is about 20 μm, for example, but is not limited thereto. A width H2 (second electrode width H2) of each of the multiple second electrodes 52 is in the range from about 50 nm to about 1000 nm, for example, and an example thereof is about 500 nm.

Each of the multiple first electrodes 51 includes a first electrode main portion 510. The first electrode main portion 510 is a portion of the first electrode 51 that overlaps with the second electrode 52 in the direction in which the first electrode 51 and the second electrode 52 face each other. Further, each of the multiple second electrodes 52 includes a second electrode main portion 520. The second electrode main portion 520 is a portion of the second electrode 52 that overlaps with the first electrode 51 in the direction in which the first electrode 51 and the second electrode 52 face each other.

In the acoustic wave device 1 according to Preferred Embodiment 1, the first electrode widths H1 of the multiple first electrodes 51 are the same, but are not limited thereto, and may be different from each other. Further, in the acoustic wave device 1 according to Preferred Embodiment 1, the second electrode widths H2 of the multiple second electrodes 52 are the same, but are not limited thereto, and may be different from each other. In the acoustic wave device 1 according to Preferred Embodiment 1, the first electrode width H1 and the second electrode width H2 are the same, but are not limited thereto, and the first electrode width H1 and the second electrode width H2 may be different from each other.

With respect to the acoustic wave device 1 according to Preferred Embodiment 1, each of the number of first electrodes 51 and the number of second electrodes 52 is illustrated as five in FIG. 4. However, the number of each of the first electrodes 51 and the second electrodes 52 is not limited to five, and may be one, two to four, six or more, or fifty or more.

The second direction D2 in which the first electrode 51 and the second electrode 52 face each other is preferably orthogonal to the polarization directions PZ1 and PZ2 (see FIG. 2) of the piezoelectric layer 4, but is not limited thereto. For example, when the piezoelectric layer 4 is not a Z-cut piezoelectric body, the first electrode 51 and the second electrode 52 may face each other in a direction orthogonal to the third direction D3 being the longitudinal direction. Note that, there is a case that the first electrode 51 and the second electrode 52 do not have a rectangular shape. In the case above, in a plan view of the first electrode 51 and the second electrode 52, the third direction D3 being the longitudinal direction may be a direction of a long side of a circumscribed polygon circumscribing the first electrode 51 and the second electrode 52. Note that, when the first wiring portion 61 and the second wiring portion 62 are connected to the first electrode 51 and the second electrode 52, the "circumscribed polygon circumscribing the first electrode and the second electrode 52" at least includes a polygon circumscribing the portion of the first electrode 51 and the second electrode 52 excluding the portion connected to the first wiring portion 61 or the second wiring portion 62.

Figure 7:
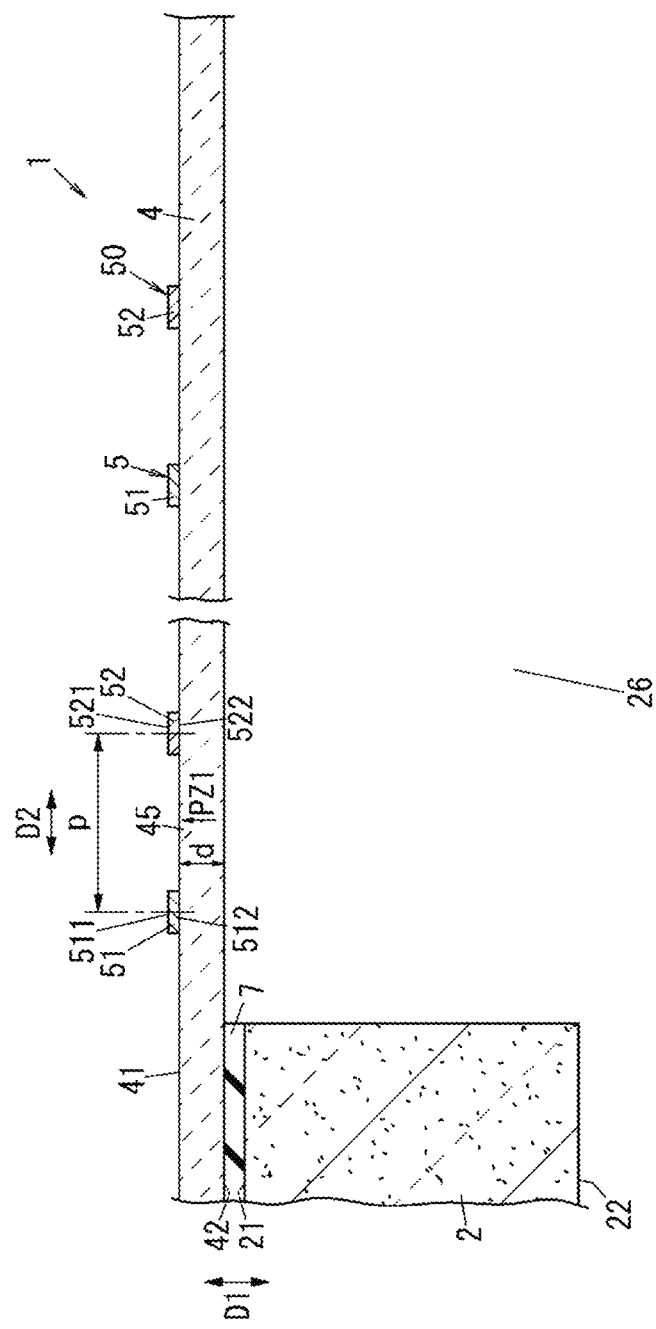
FIG. 7 is a sectional view of the acoustic wave device taken along a line A2-A2 in FIG. 4.

Each of the multiple first electrodes 51 includes a first main surface 511 and a second main surface 512 intersecting with the thickness direction D1 of the piezoelectric layer 4, as illustrated in FIG. 7. In each of the multiple first electrodes 51, of the first main surface 511 and the second main surface 512, the second main surface 512 is positioned on the first main surface 41 side of the piezoelectric layer 4, and is in planar contact with the first main surface 41 of the piezoelectric layer 4.

Each of the multiple second electrodes 52 includes a first main surface 521 and a second main surface 522 intersecting with the thickness direction D1 of the piezoelectric layer 4. In each of the multiple second electrodes 52, of the first main surface 521 and the second main surface 522, the second main surface 522 is positioned on the first main surface 41 side of the piezoelectric layer 4, and is in planar contact with the first main surface 41 of the piezoelectric layer 4.

The multiple first electrodes 51 and the multiple second electrodes 52 have electrical conductivity. The material of each first electrode 51 and each second electrode 52 is Al (aluminum), Cu (copper), Pt (platinum), Au (gold), Ag (silver), Ti (titanium), Ni (nickel), Cr (chromium), Mo (molybdenum), W (tungsten), an alloy containing any of these metals as a main component, or the like, for example. Further, each first electrode 51 and each second electrode 52 may have a structure in which multiple metal films made of these metals or alloys are laminated. Each first electrode 51 and each second electrode 52 include a laminated film including an adhesion film made of a Ti film, and a main electrode film made of an Al film or an AlCu film formed on the adhesion film, for example. The thickness of the adhesion film is about 10 nm, for example. Further, the thickness of the main electrode film is about 80 nm, for example. In the AlCu film, the concentration of Cu is preferably about 1 wt % or more and about 20 wt % or less.

(2.5) First Wiring Portion and Second Wiring Portion

The first wiring portion 61 includes a first busbar 611, as illustrated in FIG. 4. The first busbar 611 is a conductor portion for making the multiple first electrodes 51 have the same electric potential. The first busbar 611 has an elongated shape (linear shape) whose longitudinal direction is the second direction D2. The first busbar 611 is connected to the multiple first electrodes 51. The multiple first electrodes 51 connected to the first busbar 611 extend toward a second busbar 621. In the acoustic wave device 1, the first conductor portion including the multiple first electrodes 51 and the first busbar 611 has a comb-like shape in a plan view from the thickness direction D1 of the piezoelectric layer 4. The first busbar 611 is integrally provided with the multiple first electrodes 51, but is not limited thereto.

The second wiring portion 62 includes the second busbar 621. The second busbar 621 is a conductor portion for making the multiple second electrodes 52 have the same electric potential. The second busbar 621 has an elongated shape (linear shape) whose longitudinal direction is the second direction D2. The second busbar 621 is connected to the multiple second electrodes 52. The multiple second electrodes 52 connected to the second busbar 621 extend toward the first busbar 611. In the acoustic wave device 1, the second conductor portion including the multiple second electrodes 52 and the second busbar 621 has a comb-like shape in a plan view from the thickness direction D1 of the piezoelectric layer 4. The second busbar 621 is integrally provided with the multiple second electrodes 52, but is not limited thereto.

The first busbar 611 and the second busbar 621 face each other in the third direction D3.

The first wiring portion 61 and the second wiring portion 62 have electrical conductivity. The material of the first wiring portion 61 and the second wiring portion 62 is Al, Cu, Pt, Au, Ag, Ti, Ni, Cr, Mo, W, an alloy including any of these metals as a main component, or the like, for example. Further, the first wiring portion 61 and the second wiring portion 62 may have a structure in which multiple metal films made of these metals or alloys are laminated. The first wiring portion 61 and the second wiring portion 62 include a laminated film of an adhesion film made of a Ti film, and a main wiring film made of an Al film or an AlCu film formed on the adhesion film, for example. The thickness of the adhesion film is about 10 nm, for example. Further, the thickness of the main wiring film is about 80 nm, for example. In the AlCu film, the concentration of Cu is preferably about 1 wt % or more and about 20 wt % or less.

In the acoustic wave device 1, from the viewpoint of reducing the resistance of the first busbar 611 and the second busbar 621, each of the first busbar 611 and the second busbar 621 may include a metal film on the main wiring film. Further, the thickness of each of the first wiring portion 61 and the second wiring portion 62 may be thicker than the thickness of each of the first electrode 51 and the second electrode 52.

(2.6) First Divided Resonator and Second Divided Resonator

The first divided resonator RS3 includes a first installation portion 401. The first installation portion 401 includes a first electrode portion 501 of multiple electrode portions 50 and a first region 451 of the piezoelectric layer 4. The first region 451 is provided with the first electrode portion 501.

The second divided resonator RS4 includes a second installation portion 402. The second installation portion 402 includes a second electrode portion 502 of the multiple electrode portions 50 and a second region 452 of the piezoelectric layer 4. The second region 452 is provided with the second electrode portion 502.

The support substrate 2 includes multiple cavities 26. The multiple cavities 26 include a first cavity 26a and a second cavity 26b. Here, the first cavity 26a is an example of a "first energy confinement layer", and the second cavity 26b is an example of a "second energy confinement layer". The first cavity 26a at least partially exposes the first region 451 of the piezoelectric layer 4. The second cavity 26b at least partially exposes the second region 452 of the piezoelectric layer 4. In the support substrate 2, the first cavity 26a and the second cavity 26b are integrally provided. That is, a member such as a wall portion is not present between the first cavity 26a and the second cavity 26b.

In a plan view from the thickness direction D1, the first cavity 26a overlaps with the first electrode 51 and the second electrode 52 of the first electrode portion 501, and a portion of the piezoelectric layer 4 between the first electrode 51 and the second electrode 52 of the first electrode portion 501. In a plan view from the thickness direction D1, the second cavity 26b overlaps with the first electrode 51 and the second electrode 52 of the second electrode portion 502, and a portion of the piezoelectric layer 4 between the first electrode 51 and the second electrode 52 of the second electrode portion 502. In other words, in a plan view from the thickness direction D1 of the piezoelectric layer 4, the first cavity 26a overlaps with the first region 451 on which the first electrode portion 501 is provided, and the second cavity 26b overlaps with the second region 452 on which the second electrode portion 502 is provided. In FIG. 2, the first cavity 26a overlaps with the entire first region 451 in a plan view from the thickness direction D1 of the piezoelectric layer 4, and the second cavity 26b overlaps with the entire second region 452 in a plan view from the thickness direction D1 of the piezoelectric layer 4. However, it is sufficient that the first cavity 26a at least partially overlaps with the first region 451, and the second cavity 26b at least partially overlaps with the second region 452. Further, it is not necessary that the cavity 26 partially overlaps with each of the first wiring portion 61 and the second wiring portion 62 in a plan view from the thickness direction D1 of the piezoelectric layer 4.

Furthermore, it is not required that the first region 451 is at least partially exposed and the second region 452 is at least partially exposed, as long as the first cavity 26a overlaps with the first region 451 and the second cavity 26b overlaps with the second region 452 in a plan view from the thickness direction D1 of the piezoelectric layer 4. Specifically, it is allowed that a dielectric film laminated on the first region 451 of the piezoelectric layer 4 is present between the first region 451 and the first cavity 26a, and a dielectric film laminated on the second region 452 of the piezoelectric layer 4 is present between the second region 452 and the second cavity 26b.

Incidentally, a thickness d1 of the first divided resonator RS3 and a thickness d2 of the second divided resonator RS4 are different from each other. The thickness d1 of the first divided resonator RS3 is the thickness of the first installation portion 401, and is the thickness of the piezoelectric layer 4 in the first region 451, here. Note that, the thickness of the first installation portion 401 may be the total thickness being the sum of the thickness of the first electrode portion 501 included in the first installation portion 401 and the thickness of the piezoelectric layer 4 in the first region 451. Also, the thickness of the first installation portion 401 may be the thickness of only the first electrode portion 501 included in the first installation portion 401 or the thickness of only the piezoelectric layer 4 in the first region 451. In a case that an insulation layer or the like is provided on the first main surface 41 of the piezoelectric layer 4 or the second main surface 42 of the piezoelectric layer 4 in the first region 451, the thickness of the first installation portion 401 may be the thickness of only the insulation layer, or the total thickness being the sum of the thickness of the first electrode portion 501, the thickness of the piezoelectric layer 4 in the first region 451, and the thickness of the insulation layer in the first region 451. The thickness of the second divided resonator RS4 is the thickness of the second installation portion 402, and is the thickness of the piezoelectric layer 4 in the second region 452, here. Note that, the thickness of the second installation portion 402 may be the total thickness being the sum of the thickness of the second electrode portion 502 included in the second installation portion 402 and the thickness of the piezoelectric layer 4 in the second region 452. Also, the thickness of the second installation portion 402 may be the thickness of only the second electrode portion 502 included in the second installation portion 402 or the thickness of only the piezoelectric layer 4 in the second region 452. Further, in a case that such as an insulation layer is provided on the first main surface 41 of the piezoelectric layer 4 or the second main surface 42 of the piezoelectric layer 4 in the second region 452, the thickness of the second installation portion 402 may be the thickness of only the insulation layer, or the total thickness being the sum of the thickness of the second electrode portion 502, the thickness of the piezoelectric layer 4 in the second region 452, and the thickness of the insulation layer in the second region 452. That is, the case that the thickness d1 of the first divided resonator RS3 and the thickness d2 of the second divided resonator RS4 are different from each other includes not only a case that the total thickness of the first installation portion 401 and the total thickness of the second installation portion 402 are different from each other, but also a case that the total thickness of the first installation portion 401 and the total thickness of the second installation portion 402 are the same, and the thickness of the element included in the first installation portion 401 and the thickness of the element included in the second installation portion 402 are different from each other. With this, the resonant frequency of the ripple generated in the first divided resonator RS3 and the resonant frequency of the ripple generated in the second divided resonator RS4 may be made different from each other. In other words, it is possible to disperse the unnecessary wave ripples by making the resonant frequency of the unnecessary wave of the first electrode portion 501 and the resonant frequency of the unnecessary wave of the second electrode portion 502 different from each other.

Further, the polarity of the first divided resonator RS3 and the polarity of the second divided resonator RS4 are different from each other. In Preferred Embodiment 1, the polarization direction PZ1 of the piezoelectric layer 4 in the first divided resonator RS3 and the polarization direction PZ2 of the piezoelectric layer 4 in the second divided resonator RS4 are different from each other. With this, linearity may be improved.

(3) Method of Manufacturing Acoustic Wave Device

In the method of manufacturing the acoustic wave device 1, the first to fifth processes are performed after the support substrate 2 is prepared, for example. In the first process, the silicon oxide film 7 is provided on the first main surface 21 of the support substrate 2. In the second process, the piezoelectric substrate is defined by the piezoelectric layer 4 and the support substrate 2 being bonded to each other via the silicon oxide film 7. In the third process, the piezoelectric layer 4 made of part of the piezoelectric substrate is formed by thinning the piezoelectric substrate. In the fourth process, the multiple first electrodes 51, the multiple second electrodes 52, the first wiring portion 61, and the second wiring portion 62 are formed on the first main surface 41 of the piezoelectric layer 4. In the fifth process, the cavity 26 is formed from the second main surface 22 of the support substrate 2. In the fourth process described above, the first electrode 51, the second electrode 52, the first wiring portion 61, and the second wiring portion 62 are formed by using such as a photolithography technique, an etching technique, or a thin film forming technique. Further, in the fifth process described above, a region of the support substrate 2 where the cavity 26 is to be formed is etched using such as a photolithography technique or an etching technique. In the fifth process, the support substrate 2 is etched using the silicon oxide film 7 as an etching stopper layer, and then the unnecessary portion of the silicon oxide film 7 is removed by etching to partially expose the second main surface 42 of the piezoelectric layer 4. When preparing the single-crystal silicon substrate, a single-crystal silicon wafer is prepared, and in the second process, a piezoelectric wafer is used as the piezoelectric substrate. In the method of manufacturing the acoustic wave device 1, a wafer including the multiple acoustic wave devices 1 is cut with a dicing machine to obtain the multiple acoustic wave devices 1 (chips).

The method of manufacturing the acoustic wave device 1 is an example and is not particularly limited. For example, the piezoelectric layer 4 may be formed using a film formation technique. In the case above, the method of manufacturing the acoustic wave device 1 includes a process of forming the piezoelectric layer 4 instead of the third process and the fourth process. The piezoelectric layer 4 formed by the film formation technique may be a single-crystal or a twin-crystal, for example. The film formation technique is a CVD (Chemical Vapor Deposition) method, for example, but is not limited thereto. Further, the piezoelectric layer 4 is subjected to poling treatment.

(4) Operation and Characteristics of Acoustic Wave Device

The acoustic wave device 1 according to Preferred Embodiment 1 is an acoustic wave device using the thickness shear primary mode bulk wave. As described above, the thickness shear primary mode bulk wave is a bulk wave whose propagation direction is the thickness direction D1 of the piezoelectric layer 4 due to the thickness shear vibration of the piezoelectric layer 4, and is a bulk wave in which the number of nodes in the thickness direction D1 of the piezoelectric layer 4 is one. The thickness shear vibration is excited by the first electrode 51 and the second electrode 52. The thickness shear vibration is excited in the defined region 45 between the first electrode 51 and the second electrode 52 in a plan view from the thickness direction D1 in the piezoelectric layer 4. The thickness shear vibration can be confirmed using FEM (Finite Element Method), for example. More particularly, the thickness shear vibration can be confirmed by the analysis of strain based on the analysis of a displacement distribution using FEM, for example. The analysis uses such as parameters of the piezoelectric layer 4 (such as material, Euler angles, thickness), and parameters of the first electrode 51 and the second electrode 52 (such as material, thickness, distance between center lines of the first electrode 51 and the second electrode 52). The Euler angles of the piezoelectric layer 4 can be obtained by analysis.

Here, the difference between the Lamb wave used in the acoustic wave device in the past and the thickness shear primary mode bulk wave will be described with reference to FIG. 6A and FIG. 6B.

Figure 6A:
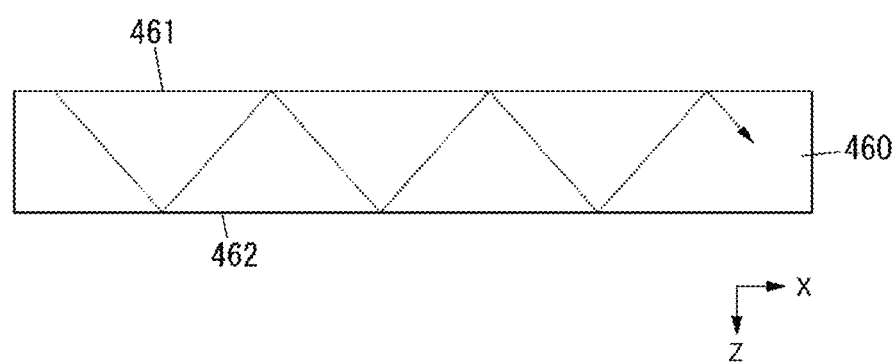
FIG. 6A is an explanatory diagram of a Lamb wave.

FIG. 6A is a schematic elevational cross-sectional view for explaining a Lamb wave propagating through the piezoelectric substrate 460 of the acoustic wave device described in Patent Document 1. In the acoustic wave device above, a wave propagates through the piezoelectric substrate 460 as indicated by an arrow. Here, the piezoelectric substrate 460 includes a first main surface 461 and a second main surface 462 opposed to each other. In FIG. 6A, the Z-direction and the X-direction are illustrated separately from the piezoelectric substrate 460. In FIG. 6A, the Z-direction is a thickness direction connecting the first main surface 461 and the second main surface 462 of the piezoelectric substrate 460. The X-direction is a direction in which multiple first electrode fingers and multiple second electrode fingers of an IDT electrode are arranged side by side. In the Lamb wave, the acoustic wave is a plate wave propagating in the X-direction as illustrated in FIG. 6A. Since an acoustic wave propagates in the X-direction, two reflectors are disposed one by one on both sides of an IDT electrode to obtain desired resonant characteristics in a conventional acoustic wave device. Therefore, in a conventional acoustic wave device, since propagation loss of an acoustic wave occurs, when the size is reduced, that is, when the number of pairs of the first electrode finger and the second electrode finger is reduced, the Q factor decreases.

Figure 6B:
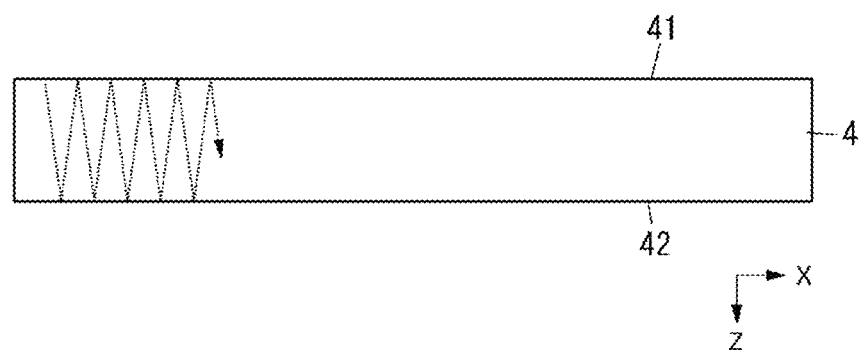
FIG. 6B is an explanatory diagram of a thickness shear primary mode bulk wave.

Meanwhile, in the acoustic wave device according to a reference mode, since the vibration displacement is in the thickness shear direction, the acoustic wave substantially propagates in the direction connecting the first main surface 41 and the second main surface 42 of the piezoelectric layer 4, that is, in the Z-direction, and resonates, as illustrated in FIG. 6B. That is, the X-direction component of the acoustic wave is remarkably smaller than the Z-direction component. In the acoustic wave device according to the reference mode, since resonant characteristics are obtained by the propagation of a wave in the Z-direction, a reflector is not necessarily required. Therefore, in the acoustic wave device according to the reference mode, no propagation loss occurs when a wave propagates to the reflector. With this, in the acoustic wave device according to the reference mode, even when the number of electrode pairs includes the first electrode 51 and the second electrode 52 is decreased in order to further reduce the size, a decrease in Q factor is unlikely to occur.

Figure 8:
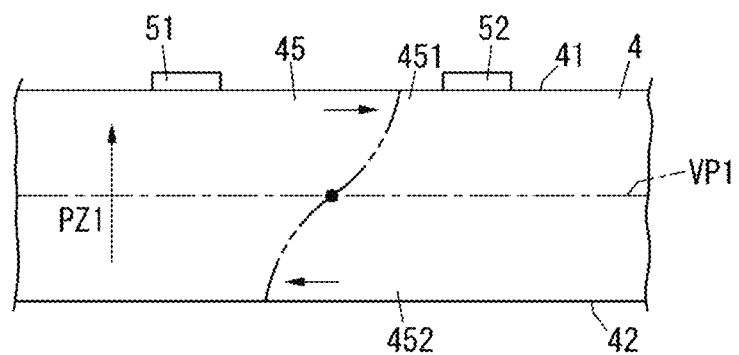
FIG. 8 is an explanatory diagram of the operation of the acoustic wave device.
Figure 9:
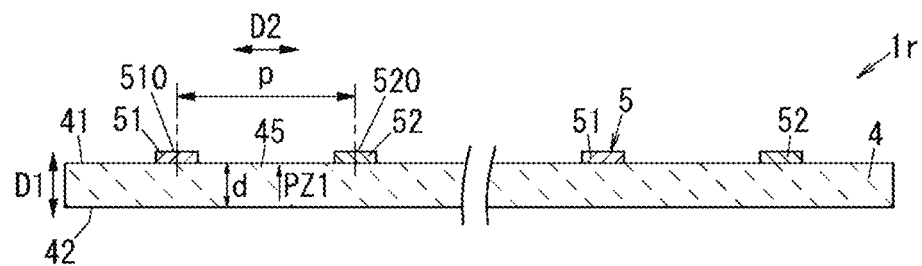
FIG. 9 is an explanatory diagram of a structural model of an acoustic wave device according to a reference mode.

In the acoustic wave device 1 according to Preferred Embodiment 1, the amplitude directions of the thickness shear primary mode bulk wave are opposite to each other in the first region 451 and the second region 452 that are included in the defined region 45 of the piezoelectric layer 4, as illustrated in FIG. 8. In FIG. 8, a dashed-and-double-dotted line schematically indicates a bulk wave when a voltage, in which electric potential of the second electrode 52 is higher than that of the first electrode 51, is applied between the first electrode 51 and the second electrode 52. The first region 451 is a region of the defined region 45 between the first main surface 41 and a virtual plane VP1 that is orthogonal to the thickness direction D1 of the piezoelectric layer 4 and divides the piezoelectric layer 4 into two. The second region 452 is a region of the defined region 45 between the second main surface 42 and the virtual plane VP1.

A structural model 1r (see FIG. 9) of the acoustic wave device according to the reference mode using a thickness shear primary mode bulk wave was simulated to obtain characteristics. With respect to the structural model 1r, the same elements as those of the acoustic wave device 1 according to Preferred Embodiment 1 are denoted by the same reference signs, and a description thereof will be omitted.

The structural model 1r differs from the acoustic wave device 1 according to Preferred Embodiment 1 in that the first wiring portion 61 and the second wiring portion 62 are not included. In the simulation, the number of pairs of the first electrode 51 and the second electrode 52 was infinite, and the piezoelectric layer 4 was 120° rotated Y-cut X-propagation $LiNbO_3$.

In the structural model 1r, the piezoelectric layer 4 is a membrane, and the second main surface 42 of the piezoelectric layer 4 is in contact with air. In the structural model 1r, in any section (FIG. 9) along the thickness direction D1 of the piezoelectric layer 4, the distance between the center lines of the first electrode 51 and the second electrode 52 is denoted as p, and the thickness of the piezoelectric layer 4 is denoted as d. Further, in the structural model 1r, in a plan view from the thickness direction D1 of the piezoelectric layer 4, the area of the first electrode main portion 510 is denoted as S1, the area of the second electrode main portion 520 is denoted as S2, the area of the defined region 45 is denoted as S0, and a structural parameter defined by (S1+S2)/(S1+S2+S0) is denoted as MR. Note that, when at least one of the first electrode 51 and the second electrode 52 is provided in multiple in the piezoelectric layer 4 (in other words, when the first electrode 51 and the second electrode 52 make an electrode pair, 1.5 or more electrode pairs are provided in the piezoelectric layer 4), distances p between the center lines are each the distance between the center lines of the adjacent first electrode 51 and the second electrode 52.

Figure 10A:
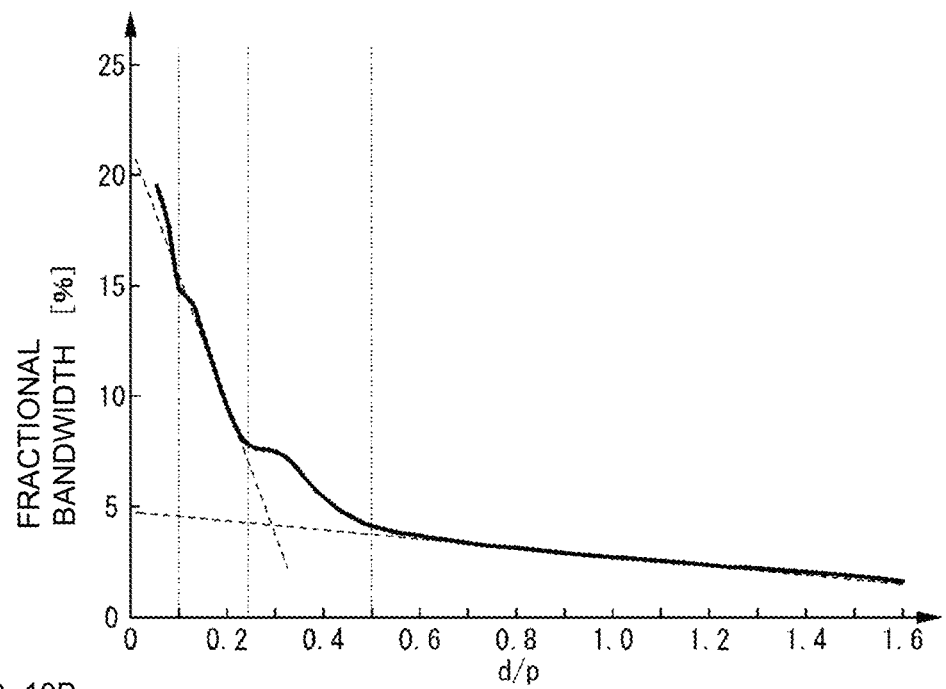
FIG. 10A is a graph of a relationship between the fractional bandwidth of a thickness shear mode and [thickness of piezoelectric layer]/[distance between center lines of first electrode and second electrode], in the structural model of the acoustic wave device.
Figure 10B:
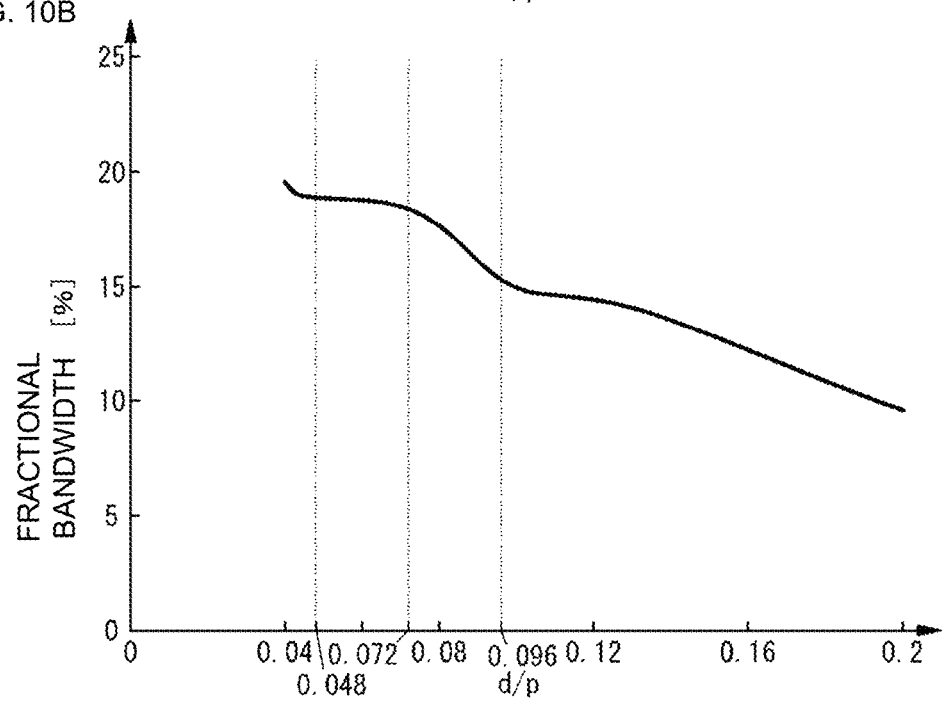
FIG. 10B is a graph of a relationship between the fractional bandwidth of the thickness shear mode and [thickness of piezoelectric layer]/[distance between center lines of two electrodes defining a pair], in the structural model of the acoustic wave device. The range of 0 to about 0.2 on the horizontal axis of FIG. 10A is enlarged and illustrated in FIG. 10B.

FIGS. 10A and 10B are graphs illustrating the relationship between the fractional bandwidth and d/p when the first electrode 51 and the second electrode 52 are applied electric potential different from each other in the structural model 1r. In FIGS. 10A and 10B, the horizontal axis represents d/p and the vertical axis represents the fractional bandwidth. FIGS. 10A and 10B illustrate a case that the piezoelectric layer 4 is 120° rotated Y-cut X-propagation $LiNbO_3$, but the same tendency is observed in the cases of other cut-angles. Further, in the structural model 1r of the acoustic wave device, even when the material of the piezoelectric layer 4 is $LiTaO_3$, the relationship between the fractional bandwidth and d/p has the same tendency as that in FIGS. 10A and 10B. Furthermore, in the structural model 1r of the acoustic wave device, regardless of the number of pairs of the first electrode 51 and the second electrode 52, the relationship between the fractional bandwidth and d/p has the same tendency as that in FIGS. 10A and 10B. Still further, in the structural model 1r of the acoustic wave device, when the second main surface 42 of the piezoelectric layer 4 is in contact with not only air but also an acoustic reflection layer, the relationship between the fractional bandwidth and d/p has the same tendency as that in FIGS. 10A and 10B.

It can be seen in FIG. 10A that, in the structural model 1r of the acoustic wave device, the value of the fractional bandwidth drastically changes with d/p=about 0.5 as an inflection point. In the structural model 1r of the acoustic wave device, when d/p>about 0.5, the coupling coefficient is low and the fractional bandwidth is less than about 5%, no matter how much d/p is changed within the range of about 0.5<d/p<about 1.6. Meanwhile, in the structural model 1r of the acoustic wave device, when d/p ≤about 0.5, it is possible to increase the coupling coefficient and make the fractional bandwidth 5% or more, by changing d/p within the range of 0<d/p≤about 0.5.

Further, in the structural model 1r of the acoustic wave device, when d/p≤about 0.24, it is possible to further increase the coupling coefficient and make the fractional bandwidth still larger, by changing d/p within the range of 0<d/p≤about 0.24. Also in the acoustic wave device 1 according to Preferred Embodiment 1, the relationship between the fractional bandwidth and d/p thereof has the same tendency as the relationship between the fractional bandwidth and d/p in the structural model 1r of the acoustic wave device, when a distance between center lines of the first electrode 51 and the second electrode 52 defining a pair is denoted as p, and the thickness of the piezoelectric layer 4 is denoted as d in any section along the thickness direction D1 of the piezoelectric layer 4, as illustrated in FIG. 7.

Furthermore, as is clear in FIG. 10A, when d/p≤about 0.10, it is possible to further increase the coupling coefficient and make the fractional bandwidth still larger, by changing d/p within the range of 0<d/p≤about 0.10.

FIG. 10B is a graph obtained by enlarging a portion of FIG. 10A. As seen in FIG. 10B, since the fractional bandwidth changes with d/p=about 0.096 as an inflection point, when d/p≤about 0.096, it is possible to further increase the coupling coefficient and make the fractional bandwidth still larger in comparison with the case of about 0.096<d/p, by changing d/p within the range of 0<d/p≤about 0.096. Further, as seen in FIG. 10B, since the fractional bandwidth changes with d/p=about 0.072 and about 0.048 as inflection points, when about 0.048≤d/p about 0.072, it is possible to suppress the change of the coupling coefficient due to the change of d/p and to make the fractional bandwidth a substantially constant value.

Figure 11:
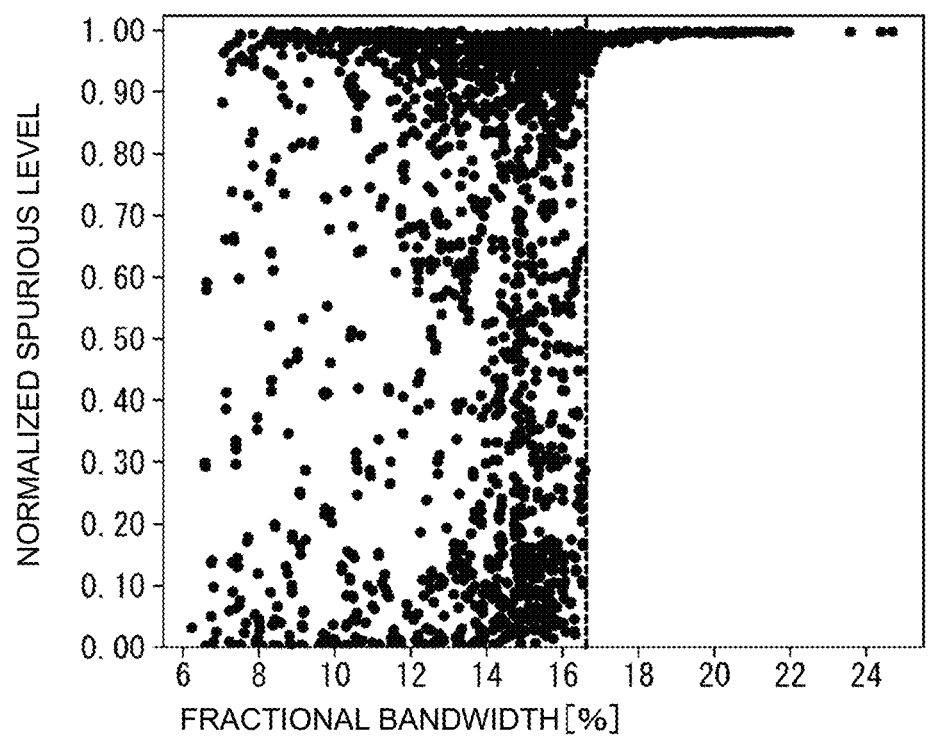
FIG. 11 is a graph of a relationship between the fractional bandwidth of the thickness shear mode and a normalized spurious level in the structural model of the acoustic wave device.

FIG. 11 is a graph plotting spurious levels in a frequency band between the resonant frequency and the anti-resonant frequency in the structural model r1 of the acoustic wave device of the reference mode using the thickness shear mode. The spurious levels are plotted changing the thickness d of the piezoelectric layer 4, the distance p between the center lines of the first electrode 51 and the second electrode 52, the first electrode width H1, and the second electrode width H2. In FIG. 11, the horizontal axis represents the fractional bandwidth and the vertical axis represents the normalized spurious level. The normalized spurious level is a value in which the spurious level is normalized with the spurious level at a fractional bandwidth (about 22%, for example) as 1. In the fractional bandwidth, the spurious level has the same value even when the thickness d of the piezoelectric layer 4, the first electrode width H1, and the second electrode width H2 are changed. FIG. 11 illustrates a case that Z-cut LiNbO$_3$ capable of more suitably exciting the thickness shear mode is preferably used as the piezoelectric layer 4, but the same tendency is observed in the cases of other cut-angles. Further, in the structural model 1r of the acoustic wave device, when the material of the piezoelectric layer 4 is LiTaO$_3$, the relationship between the normalized spurious level and the fractional bandwidth has the same tendency as that in FIG. 11. Furthermore, in the structural model 1r of the acoustic wave device, regardless of the number of pairs of the first electrode 51 and the second electrode 52, the relationship between the normalized spurious level and the fractional bandwidth has the same tendency as that in FIG. 11. Still further, in the structural model 1r of the acoustic wave device, when the second main surface 42 of the piezoelectric layer 4 is in contact with not only air but also an acoustic reflection layer, the relationship between the normalized spurious level and the fractional bandwidth has the same tendency as that in FIG. 11.

Figure 12:
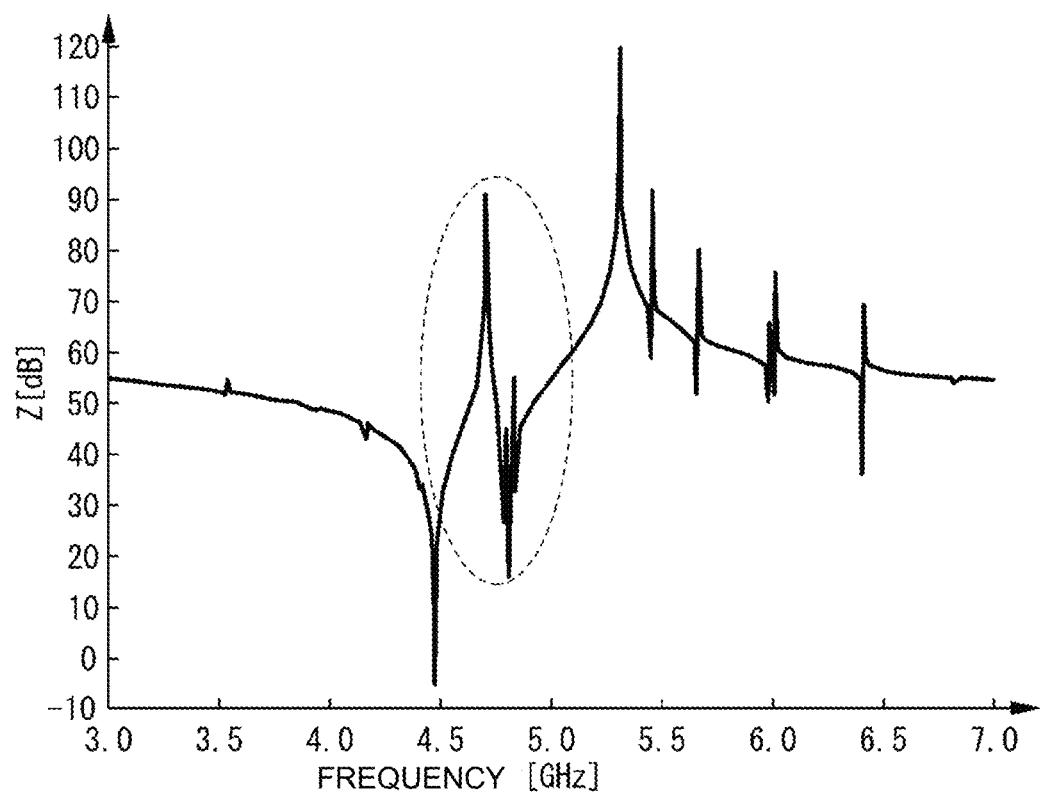
FIG. 12 is an impedance-frequency characteristics diagram of the structural model of the acoustic wave device.

It can be seen in FIG. 11 that when the fractional bandwidth exceeds about 17%, the normalized spurious level is aggregated to 1. This indicates that, when the fractional bandwidth is about 17% or more, some kind of sub-resonance is present in the band between the resonant frequency and the anti-resonant frequency as in the frequency characteristics of impedance exemplified in FIG. 12. FIG. 12 illustrates the frequency characteristics of impedance when Z-cut LiNbO$_3$ having Euler angles (0°, 0°, 90°) is preferably used as the piezoelectric layer 4, d/p=about 0.08, and MR=about 0.35. In FIG. 12, a portion of the sub-resonance is surrounded by a broken line.

As described above, when the fractional bandwidth exceeds about 17%, even when the thickness d of the piezoelectric layer 4, the distance p between the center lines of the first electrode 51 and the second electrode 52, the first electrode width H1, and the second electrode width H2 are changed, large spurious components are included in the band between the resonant frequency and the anti-resonant frequency. The spurious components above are generated by an overtone in a planar direction, mainly in the direction in which the first electrode 51 and the second electrode 52 face each other. Therefore, from the viewpoint of suppressing the spurious components in the band, the fractional bandwidth is preferably about 17% or less. Since the acoustic wave device 1 according to Preferred Embodiment 1 exhibits the same tendency as that of the structural model 1r of the acoustic wave device with respect to the relationship between the normalized spurious level and the fractional bandwidth, the fractional bandwidth is preferably about 17% or less.

Figure 13:
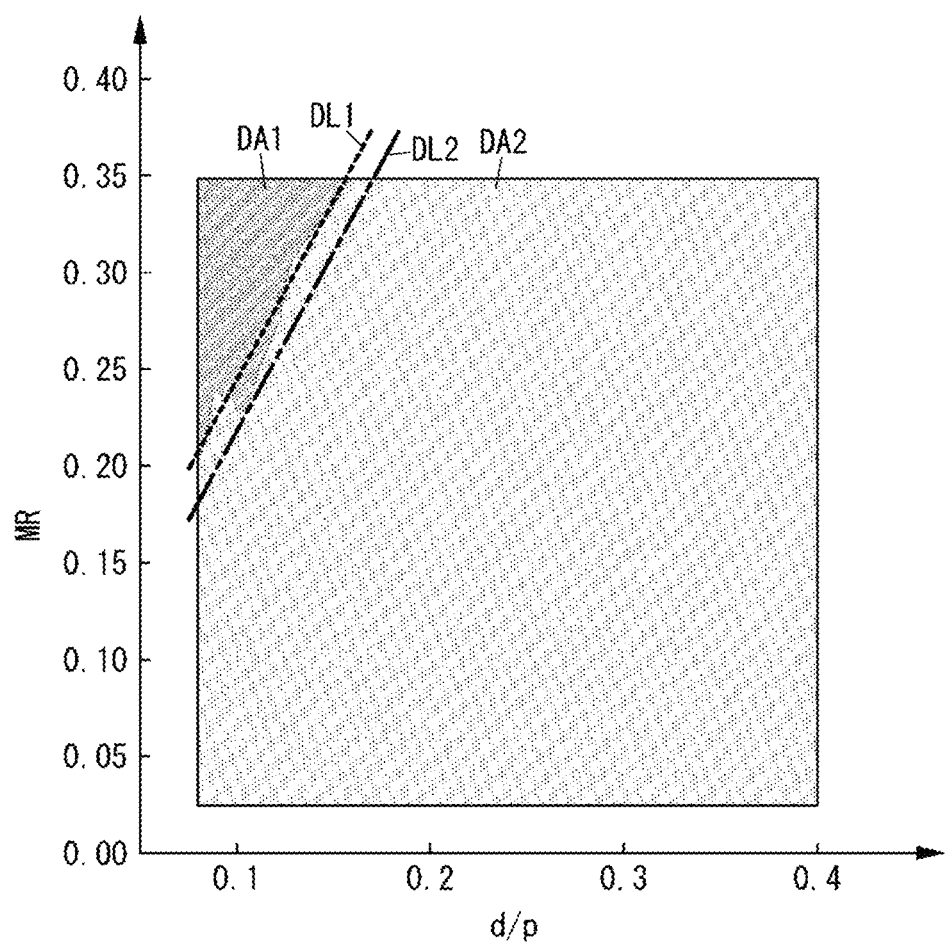
FIG. 13 is a diagram to explain a distribution of the fractional bandwidth against the combination of [thickness of piezoelectric layer]/[distance between center lines of first electrode and second electrode] and a structural parameter, in the structural model of the acoustic wave device.

FIG. 13 illustrates a first distribution region DA1 having the fractional bandwidth of more than about 17% and a second distribution region DA2 having the fractional bandwidth of about 17% or less in the structural model 1r of the acoustic wave device with d/p and MR used as parameters. In FIG. 13, Z-cut LiNbO$_3$ is used as the piezoelectric layer 4, and changed are the thickness d of the piezoelectric layer 4, the distance p between the center lines of the first electrode 51 and the second electrode 52, the first electrode width H1, and the second electrode width H2. In FIG. 13, the first distribution region DA1 and the second distribution region DA2 have different dot densities, and the dot density of the first distribution region DA1 is higher than the dot density of the second distribution region DA2. Further, in FIG. 13, an approximate straight line DL1 as a boundary line between the first distribution region DA1 and the second distribution region DA2 is indicated by a broken line. The approximate straight line DL1 is expressed by the equation of MR =about 1.75×(d/p)+0.075. Therefore, in the structural model 1r of the acoustic wave device, the fractional bandwidth is likely to be about 17% or less by satisfying the condition of MR about 1.75×(d/p)+0.075. FIG. 13 illustrates a case that Z-cut LiNbO$_3$ capable of more suitably exciting the thickness shear mode is preferably used as the piezoelectric layer 4, but the same tendency is observed in the cases of other cut-angles. Further, in the structural model 1r of the acoustic wave device, even when the material of the piezoelectric layer 4 is LiTaO$_3$, the approximate straight line DL1 is the same. Furthermore, in the structural model 1r of the acoustic wave device, regardless of the number of pairs of the first electrode 51 and the second electrode 52, the approximate straight line DL1 is the same. Still further, in the structural model 1r of the acoustic wave device, when the second main surface 42 of the piezoelectric layer 4 is in contact with not only air but also an acoustic reflection layer, the approximate straight line DL1 is the same. In the acoustic wave device 1 according to Preferred Embodiment 1, similarly to the structural model 1r of the acoustic wave device, the fractional bandwidth is likely to be about 17% or less by satisfying the condition of MR about 1.75×(d/p)+ 0.075. Note that, in FIG. 13, an approximate straight line DL2 (hereinafter, also referred to as second approximate straight line DL2) indicated by a dashed-and-dotted line separately from the approximate straight line DL1 (hereinafter, also referred to as first approximate straight line DL1) is a line indicating a boundary for surely making the fractional bandwidth about 17% or less. The second approximate straight line DL2 is expressed by the equation of MR=about 1.75×(d/p)+0.05. Therefore, in the structural model 1r of the acoustic wave device according to the reference mode and the acoustic wave device 1 according to Preferred Embodiment 1, the fractional bandwidth may surely be made 17% or less by satisfying the condition of MR about 1.75×(d/p)+0.05.

(5) Effect

The acoustic wave device 1 according to Preferred Embodiment 1 includes the piezoelectric layer 4, the first electrode 51, and the second electrode 52, and uses a thickness shear primary mode bulk wave. Further, the acoustic wave device 1 includes the first divided resonator RS3 and the second divided resonator RS4. Furthermore, the first cavity 26a at least partially overlapping with the first region 451 of the piezoelectric layer 4 and the second cavity 26b at least partially overlapping with the second region 452 of the piezoelectric layer 4 are provided in the support substrate 2, when viewed from the thickness direction of the piezoelectric layer 4. Further, in the support substrate 2, the first cavity 26a and the second cavity 26b are integrally provided. With this, the Q factor may be increased even when the size is further reduced, and it is possible to further reduce the size when the first divided resonator RS3 and the second divided resonator RS4 are provided.

The acoustic wave device 1 according to Preferred Embodiment 1 includes the piezoelectric layer 4, the first electrode 51, and the second electrode 52. With respect to the distance p between the center lines of the first electrode 51 and the second electrode 52, and the thickness d of the piezoelectric layer 4, d/p is about 0.5 or less, for example. Further, the acoustic wave device 1 includes the first divided resonator RS3 and the second divided resonator RS4. Furthermore, the first cavity 26a at least partially overlapping with the first region 451 of the piezoelectric layer 4 and the second cavity 26b at least partially overlapping with the second region 452 of the piezoelectric layer 4 are provided in the support substrate 2, when viewed from the thickness direction D1 of the piezoelectric layer 4. Further, in the support substrate 2, the first cavity 26a and the second cavity 26b are integrally provided. With this, the Q factor may be increased even when the size is further reduced, and it is possible to further reduce the size when the first divided resonator RS3 and the second divided resonator RS4 are provided.

In the acoustic wave device 1 according to Preferred Embodiment 1, the thickness d1 of the first divided resonator RS3 and the thickness d2 of the second divided resonator RS4 are different from each other. With this, the ripples may be dispersed.

In the acoustic wave device 1 according to Preferred Embodiment 1, the polarity of the first divided resonator RS3 and the polarity of the second divided resonator RS4 are different from each other. With this, the linearity may further be improved.

In the acoustic wave device 1 according to Preferred Embodiment 1, d/p is about 0.24 or less. With this, it is possible to make the fractional bandwidth still larger.

In the acoustic wave device 1 according to Preferred Embodiment 1, in a plan view from the thickness direction D1 of the piezoelectric layer 4, when the area of the first electrode main portion is denoted as S1, the area of the second electrode main portion is denoted as S2, the area of the defined region is denoted as S0, and a structural parameter defined by (S1+S2)/(S1 +S2+S0) is denoted as MR, where MR satisfies MR 1.75×(d/p) +0.075. With this, it is possible to suppress the spurious components in the band.

In the acoustic wave device 1 according to Preferred Embodiment 1, the electric potential of the first electrode 51 and the electric potential of the second electrode 52 are different from each other. With this, it is possible to prevent the first electrode 51 and the second electrode 52 defining a pair from taking floating electric potential.

Modification 1 of Preferred Embodiment 1

Figure 14:
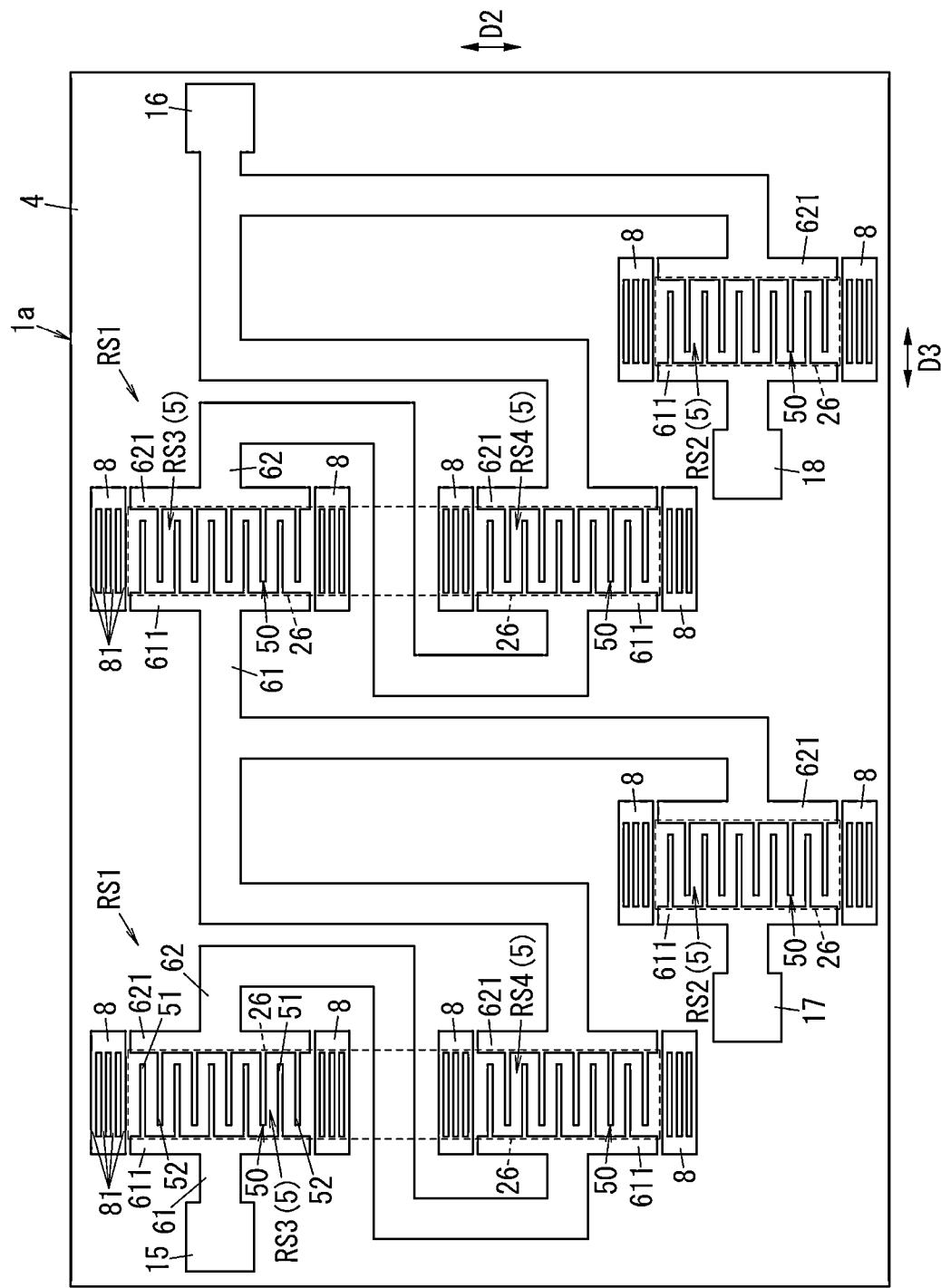
FIG. 14 is a plan view of an acoustic wave device according to Modification 1 of Preferred Embodiment 1 of the present invention.

Hereinafter, an acoustic wave device 1a according to Modification 1 will be described with reference to FIG. 14. With respect to the acoustic wave device 1a according to Modification 1, the same elements as those of the acoustic wave device 1 according to Preferred Embodiment 1 are denoted by the same reference signs, and a description thereof will be omitted.

The acoustic wave device 1a according to Modification 1 differs from the acoustic wave device 1 according to Preferred Embodiment 1 in that each of the multiple acoustic wave resonators 5 further includes two reflectors 8.

Each of the two reflectors 8 is a short-circuited grating. Each reflector 8 does not reflect a bulk wave in the primary shear mode but reflects an unnecessary surface acoustic wave propagating along the first main surface 41 of the piezoelectric layer 4. One reflector 8 of the two reflectors 8 is positioned on the side of an end first electrode 51 opposite to the second electrode 52 side. The end first electrode 51 is positioned at the end of the multiple first electrodes 51 in the direction along the propagation direction of the unnecessary surface acoustic wave of the acoustic wave device 1a. The remaining one reflector 8 of the two reflectors 8 is positioned on the side of an end second electrode opposite to the first electrode 51 side. The end second electrode 52 is positioned at the end of the multiple second electrodes 52 in the direction along the propagation direction of the unnecessary surface acoustic wave of the acoustic wave device 1a.

Each reflector 8 has multiple (four, for example) electrode fingers 81. One ends of the multiple electrode fingers 81 are short-circuited to each other, and the other ends are short-circuited to each other. In each reflector 8, the number of electrode fingers 81 is not particularly limited.

Each reflector 8 has electrical conductivity. The material of each reflector 8 is Al, Cu, Pt, Au, Ag, Ti, Ni, Cr, Mo, W, an alloy including any one of these metals as a main component, or the like, for example. Further, each reflector 8 may have a structure in which a multiple metal films made of these metals or alloys are laminated. Each reflector 8 includes a laminated film including an adhesion film made of a Ti film on the piezoelectric layer 4, and a main electrode film made of an Al film on the adhesion film, for example. The thickness of the adhesion film is about 10 nm, for example. Further, the thickness of the main electrode film is about 80 nm, for example.

In the acoustic wave device 1a according to Modification 1, each reflector 8 is a short-circuited grating, but is not limited thereto. Each reflector 8 may be an open grating, a positive-negative reflection grating, or a grating in which a short-circuited grating and an open grating are combined, for example. Further, in the acoustic wave device 1a, each acoustic wave resonator 5 includes the two reflectors 8, but may include only one of the two reflectors 8.

Modification 2 of Preferred Embodiment 1

Figure 15:
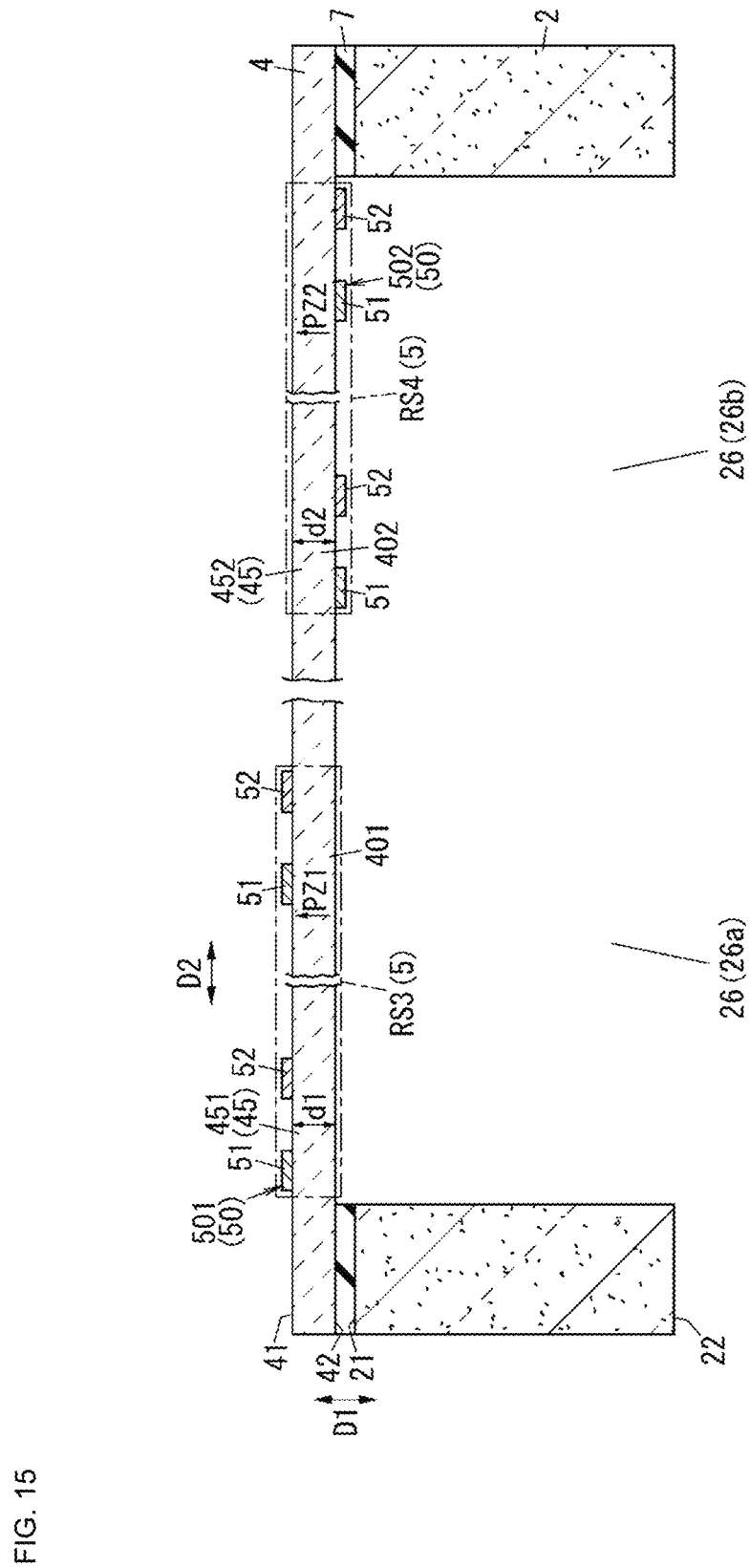
FIG. 15 is a sectional view of an acoustic wave device according to Modification 2 of Preferred Embodiment 1 of the present invention.

In Modification 2 of Preferred Embodiment 1, as illustrated in FIG. 15, the first electrode 51 and the second electrode 52 in the second divided resonator RS4 may be provided on the side opposite to the first electrode 51 and the second electrode 52 in the first divided resonator RS3. In the example of FIG. 15, the first electrode 51 and the second electrode 52 in the first divided resonator RS3 are provided on the first main surface 41 of the piezoelectric layer 4, and the first electrode 51 and the second electrode 52 in the second divided resonator RS4 are provided on the second main surface 42 of the piezoelectric layer 4. In Modification 2, the polarization direction PZ1 of the piezoelectric layer 4 in the first divided resonator RS3 is the same as the polarization direction PZ2 of the piezoelectric layer 4 in the second divided resonator RS4. With this, the linearity may further be improved.

Modification 3 of Preferred Embodiment 1

In Modification 3 of Preferred Embodiment 1, the distance p between the center lines in the first divided resonator RS3 and the distance p between the center lines in the second divided resonator RS4 may be different from each other. With this, the ripples may be dispersed without affecting the main resonance.

Modification 4 of Preferred Embodiment 1

Figure 16:
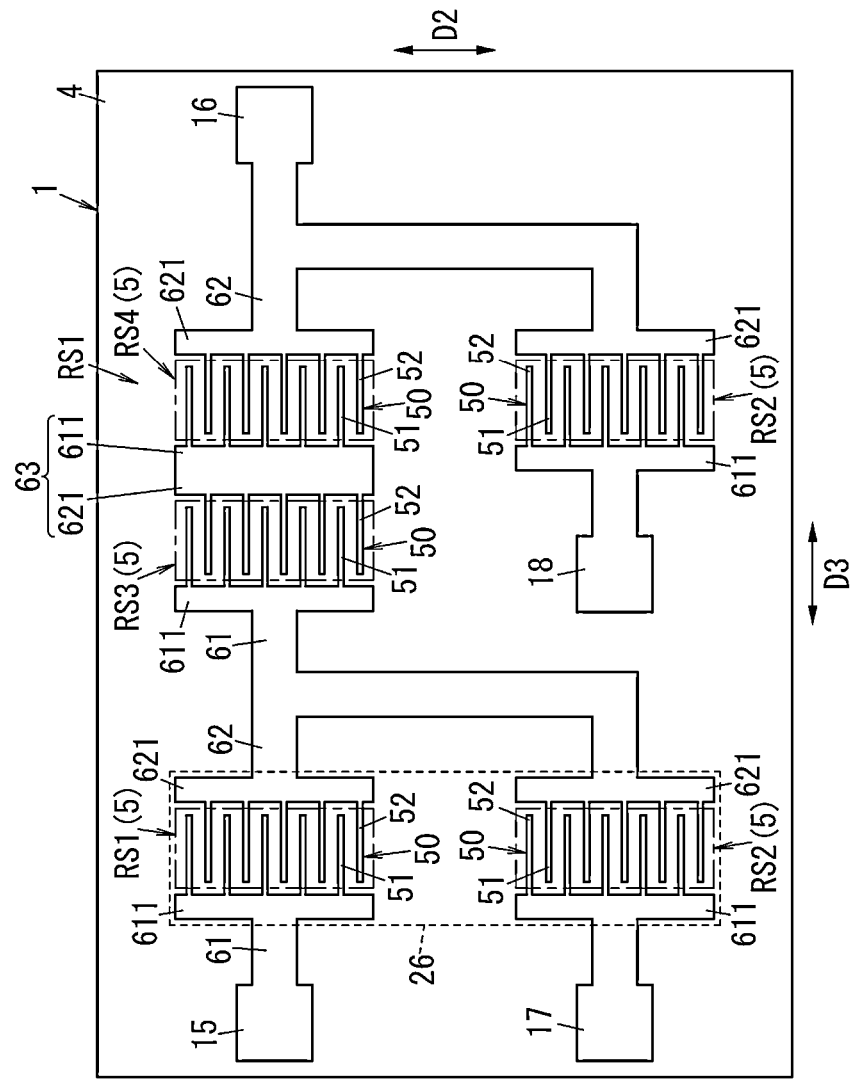
FIG. 16 is a plan view of an acoustic wave device according to Modification 4 of Preferred Embodiment 1 of the present invention.

FIG. 1 illustrates a configuration in which the series-arm resonators (first divided resonator RS3 and second divided resonator RS4) overlap with the same cavity 26 in a plan view. However, as Modification 4 of Preferred Embodiment 1, the series-arm resonator RS1 and the parallel-arm resonator RS2 may overlap with the same cavity 26 in a plan view, as illustrated in FIG. 16.

Modification 5 of Preferred Embodiment 1

Figure 17:
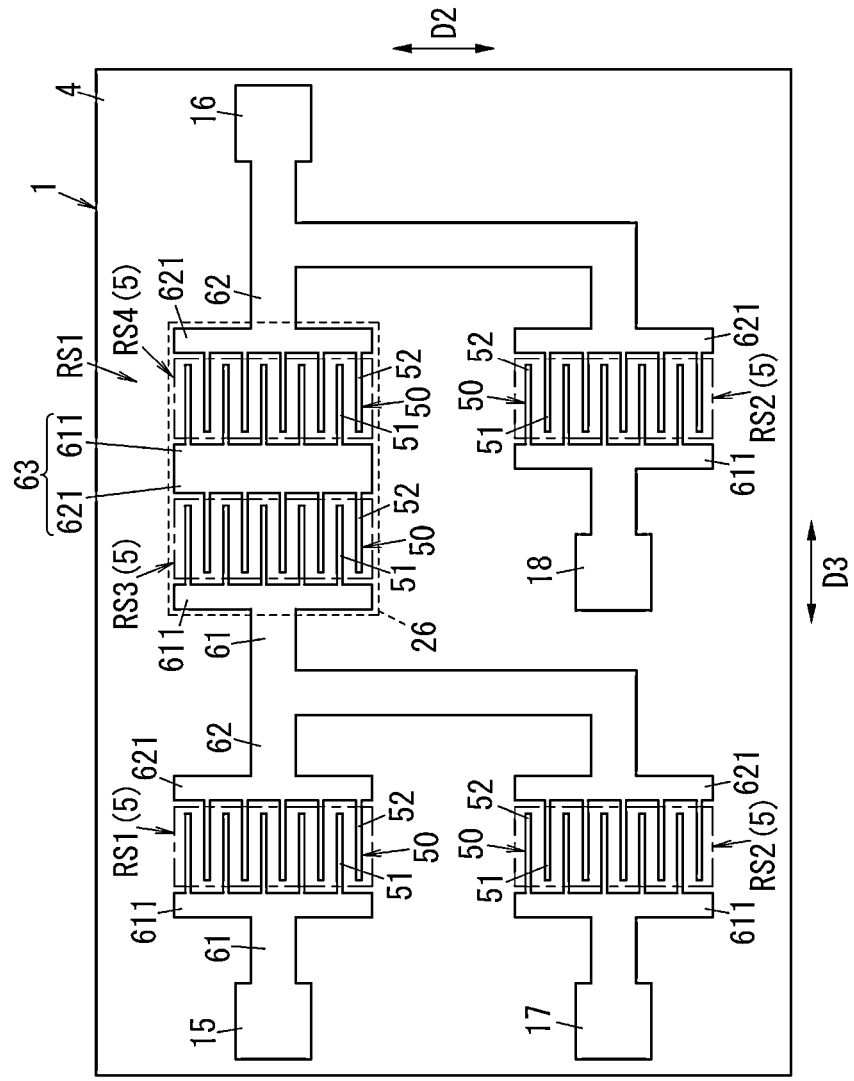
FIG. 17 is a plan view of an acoustic wave device according to Modification 5 of Preferred Embodiment 1 of the present invention.

In Modification 5 of Preferred Embodiment 1, as illustrated in FIG. 17, the first divided resonator RS3 and the second divided resonator RS4 may have a configuration as follows. The second busbar 621 of the pair of busbars (first busbar 611 and second busbar 621) included in the first divided resonator RS3, and the first busbar 611 of the pair of busbars (first busbar 611 and second busbar 621) included in the second divided resonator RS4 may be a shared interstage busbar 63.

Preferred Embodiment 2

Figure 18:
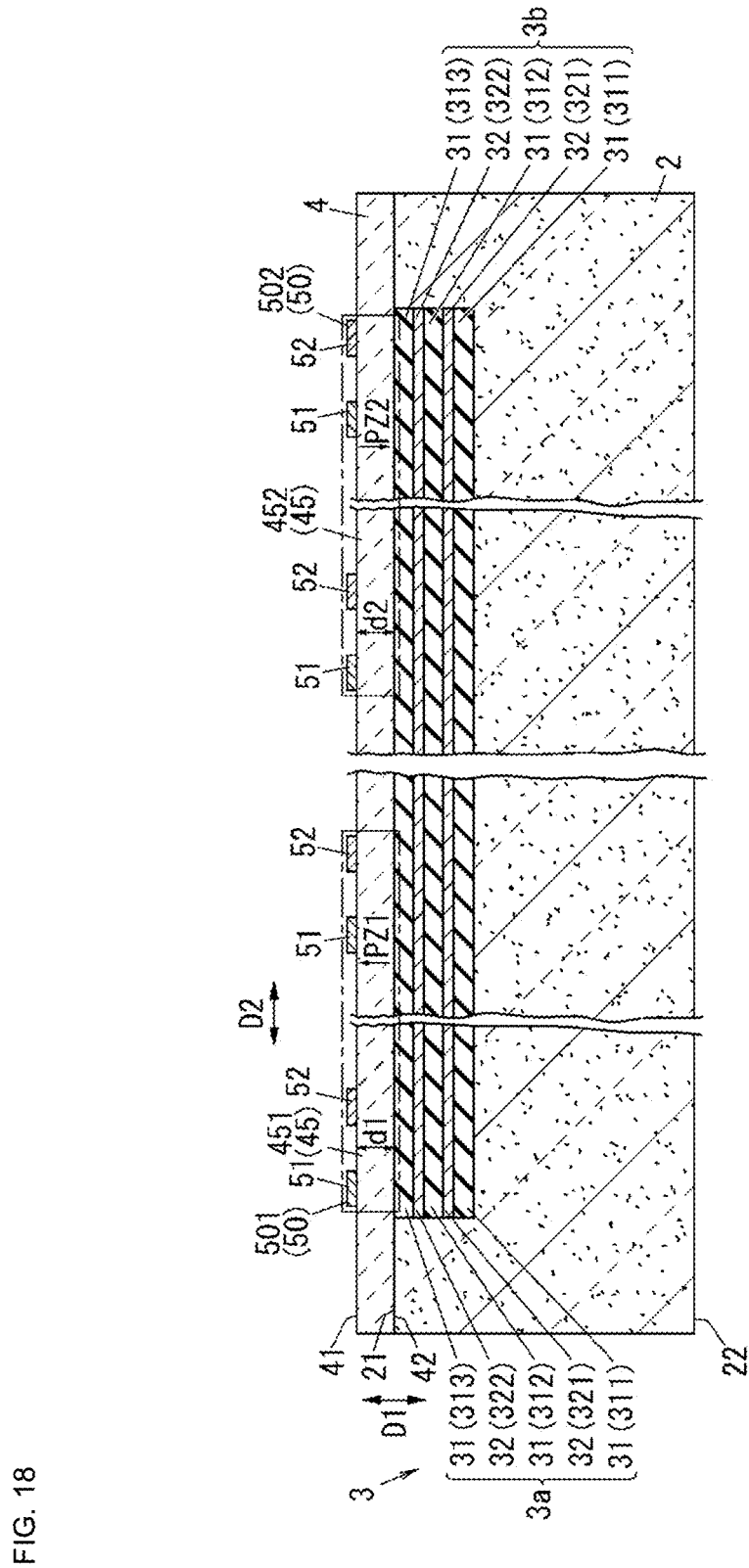
FIG. 18 is a sectional view of an acoustic wave device according to Preferred Embodiment 2 of the present invention.

Hereinafter, an acoustic wave device 1b according to Preferred Embodiment 2 will be described with reference to FIG. 18 and FIG. 19. With respect to the acoustic wave device 1b according to Preferred Embodiment 2, the same elements as those of the acoustic wave device 1 according to Preferred Embodiment 1 are denoted by the same reference signs, and the description thereof will be omitted.
(1) Configuration of Acoustic Wave Device The acoustic wave device 1b according to Preferred Embodiment 2 differs from the acoustic wave device 1 according to Preferred Embodiment 1 in that an acoustic reflection layer 3 is provided between the support substrate 2 and the piezoelectric layer 4, as illustrated in FIG. 18.

In the acoustic wave device 1b according to Preferred Embodiment 2, the acoustic reflection layer 3 is provided on the first main surface 21 of the support substrate 2, and the piezoelectric layer 4 is provided on the acoustic reflection layer 3. In the acoustic wave device 1b, the acoustic wave resonator 5 includes at least a pair of electrodes (first electrode 51 and second electrode 52) and the piezoelectric layer 4. In the acoustic wave device 1b, the acoustic wave resonator 5 further has the acoustic reflection layer 3 described above.

The acoustic reflection layer 3 includes a first acoustic reflection layer 3a overlapping with the first region 451 and a second acoustic reflection layer 3b overlapping with the second region 452 in a plan view in the thickness direction of the piezoelectric layer 4. The first acoustic reflection layer 3a is an example of the "first energy confinement layer", and the second acoustic reflection layer 3b is an example of the "second energy confinement layer". The first acoustic reflection layer 3a and the second acoustic reflection layer 3b are integrally provided.

Figure 19:
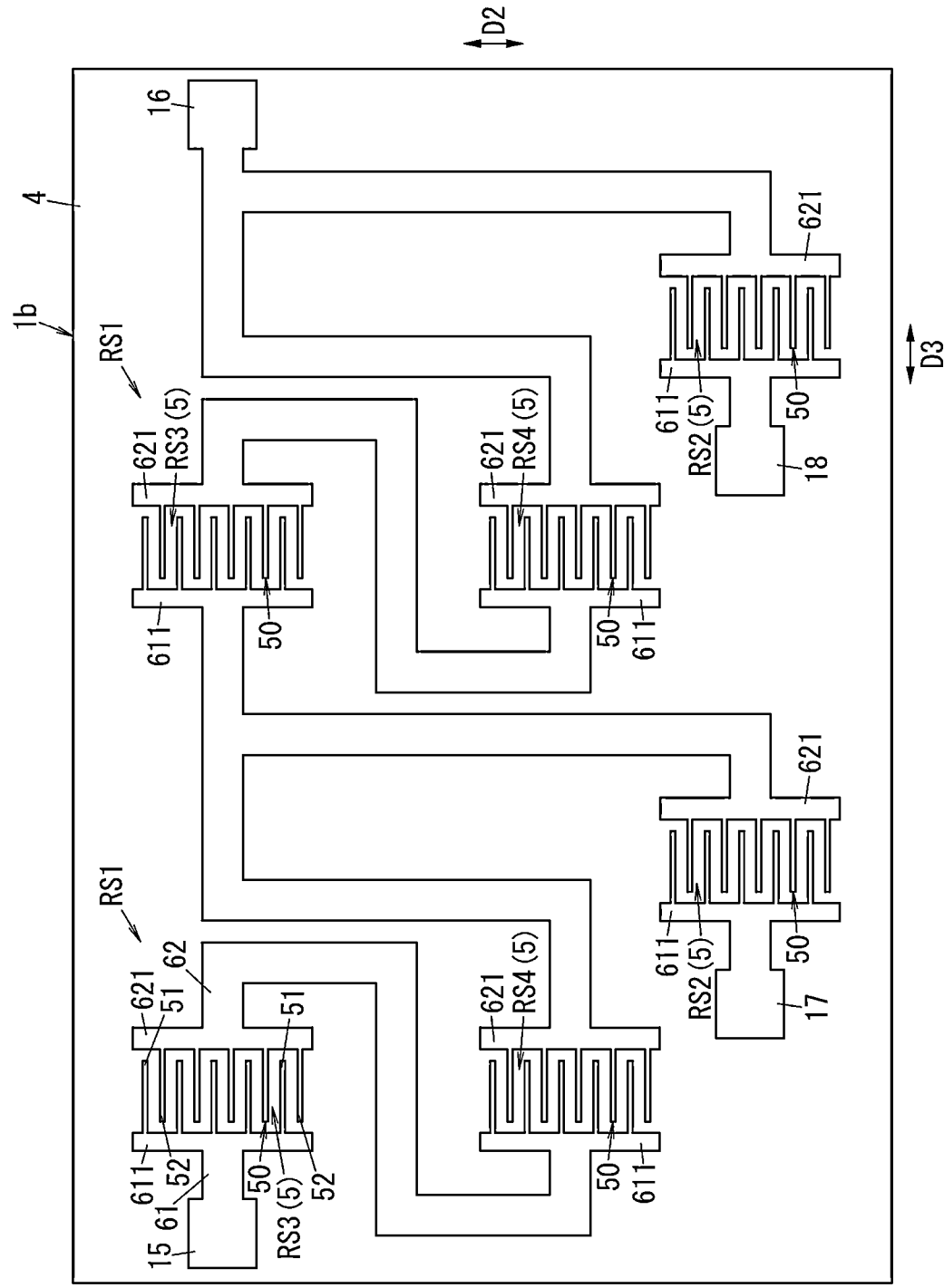
FIG. 19 is a plan view of the acoustic wave device according to Preferred Embodiment 2 of the present invention.

The acoustic wave device 1b according to Preferred Embodiment 2 is an acoustic wave filter (here, a ladder filter), similarly to the acoustic wave device 1 according to Preferred Embodiment 1, as illustrated in FIG. 19. The acoustic wave device 1b includes the input terminal 15, the output terminal 16, the multiple (two) series-arm resonators RS1, and the multiple (two) parallel-arm resonators RS2. The multiple (two) series-arm resonators RS1 are provided on the first path 12 (see FIG. 3) connecting the input terminal 15 and the output terminal 16. The multiple (two) parallel-arm resonators RS2 are respectively provided one by one on the multiple (two) second paths 13 and 14 (see FIG. 3) connecting the multiple (two) nodes N1 and N2 (see FIG. 3) on the first path 12 and the ground (ground terminals 17 and 18). The ground terminals 17 and 18 may be made common as one ground.

Each of the multiple series-arm resonators RS1 includes the first divided resonator RS3 and the second divided resonator RS4. The first divided resonator RS3 and the second divided resonator RS4 are connected in series. Note that, in each of the multiple series-arm resonators RS1, the first divided resonator RS3 and the second divided resonator RS4 may be connected in parallel. Further, each of the multiple parallel-arm resonators RS2 may include a first divided resonator and a second divided resonator. In each of the multiple parallel-arm resonators RS2, the first divided resonator and the second divided resonator are connected in series or in parallel.

In the acoustic wave device 1b, each of the first divided resonator RS3, the second divided resonator RS4, and the multiple parallel-arm resonators RS2 is the acoustic wave resonator 5. The first divided resonator RS3 and the second divided resonator RS4 are included in the multiple series-arm resonators RS1. Each of the multiple acoustic wave resonators 5 is a resonator including at least a pair of electrodes (first electrode 51 and second electrode 52). In the acoustic wave device 1b, the piezoelectric layer 4 is shared by the multiple acoustic wave resonators 5. Further, in the acoustic wave device 1b, the acoustic reflection layer 3 is divided by the multiple acoustic wave resonators 5. The resonant frequency of the parallel-arm resonator RS2 is lower than that of the series-arm resonator RS1.

(2) Acoustic Reflection Layer

The acoustic reflection layer 3 faces the multiple first electrodes 51 and the multiple second electrodes 52 in the thickness direction D1 of the piezoelectric layer 4, as illustrated in FIG. 18.

The acoustic reflection layer 3 has a function of suppressing the leakage of a bulk wave (thickness shear primary mode bulk wave described above), excited by the first electrode 51 and the second electrode 52 defining a pair, to the support substrate 2. By having the acoustic reflection layer 3, the acoustic wave device 1b may increase the effect of confining acoustic wave energy in the piezoelectric layer 4. Therefore, the acoustic wave device 1b may reduce the loss and increase the Q factor in comparison with a case that the acoustic reflection layer 3 is not provided.

The acoustic reflection layer 3 has a laminated structure in which at least one (three) low acoustic impedance layer 31 and at least one (two) high acoustic impedance layer 32 are alternately arranged in layer by layer in the thickness direction D1 of the piezoelectric layer 4. The acoustic impedance of the low acoustic impedance layer 31 is lower than that of the high acoustic impedance layer 32.

Hereinafter, for convenience of description, in the acoustic reflection layer 3, the two high acoustic impedance layers 32 may be referred to as a first high acoustic impedance layer 321 and a second high acoustic impedance layer 322 in order from the first main surface 21 of the support substrate 2. Further, the three low acoustic impedance layers 31 may be referred to as a first low acoustic impedance layer 311, a second low acoustic impedance layer 312, and a third low acoustic impedance layer 313 in order from the first main surface 21 of the support substrate 2.

In the acoustic reflection layer 3, the first low acoustic impedance layer 311, the first high acoustic impedance layer 321, the second low acoustic impedance layer 312, the second high acoustic impedance layer 322, and the third low acoustic impedance layer 313 are arranged in this order from the support substrate 2 side. Accordingly, the acoustic reflection layer 3 may reflect a bulk wave (thickness shear primary mode bulk wave) from the piezoelectric layer 4 at each of the interface between the third low acoustic impedance layer 313 and the second high acoustic impedance layer 322, the interface between the second high acoustic impedance layer 322 and the second low acoustic impedance layer 312, the interface between the second low acoustic impedance layer 312 and the first high acoustic impedance layer 321, and the interface between the first high acoustic impedance layer 321 and the first low acoustic impedance layer 311.

The material of the multiple high acoustic impedance layers 32 is Pt (platinum), for example. Further, the material of the multiple low acoustic impedance layers 31 is silicon oxide, for example. The thickness of each of the multiple high acoustic impedance layers 32 is about 94 nm, for example. Further, the thickness of each of the multiple low acoustic impedance layers 31 is about 188 nm, for example. The acoustic reflection layer 3 has two electrically conductive layers because each of the two high acoustic impedance layers 32 is formed of platinum.

The material of the multiple high acoustic impedance layers 32 is not limited to Pt, but may be a metal such as W (tungsten) or Ta (tantalum), for example. Further, the material of the multiple high acoustic impedance layers 32 is not limited to a metal, but may be an insulator, for example.

Furthermore, the multiple high acoustic impedance layers 32 are not limited to be made of the same material, but may be made of different materials, for example. Still further, the multiple low acoustic impedance layers 31 are not limited to be made of the same material, but may be made of different materials, for example.

The number of each of the high acoustic impedance layers and the low acoustic impedance layers 31 in the acoustic reflection layer 3 is not limited to two and three, and may be one, three or more, or four or more. Further, the number of high acoustic impedance layers 32 and the number of low acoustic impedance layers 31 are not limited to be different from each other, and may be the same, or the number of low acoustic impedance layers 31 may be less than the number of high acoustic impedance layers 32 by one. In order to obtain the preferable reflection in the acoustic reflection layer 3, the thickness of each of the high acoustic impedance layer 32 and the low acoustic impedance layer 31 is appropriately set in accordance with: a desired frequency of the acoustic wave device 1, and a material used in each of the high acoustic impedance layer 32 and the low acoustic impedance layer 31.

(3) Method of Manufacturing Acoustic Wave Device

In the method of manufacturing the acoustic wave device 1b, the first to fourth processes are performed after the support substrate 2 is prepared, for example. In the first process, the acoustic reflection layer 3 is formed on the first main surface 21 of the support substrate 2. In the second process, the piezoelectric substrate is defined by the piezoelectric layer 4 and the support substrate 2 being bonded to each other via the acoustic reflection layer 3. In the third process, the piezoelectric layer 4 defined by a portion of the piezoelectric substrate is formed by thinning the piezoelectric substrate. In the fourth process, the multiple first electrodes 51, the multiple second electrodes 52, the first wiring portion 61, and the second wiring portion 62 are formed on the piezoelectric layer 4. In the first process to the fourth process, a silicon wafer is used as the support substrate 2. Further, in the second process, a piezoelectric wafer is used as the piezoelectric substrate. In the method of manufacturing the acoustic wave device 1b, a wafer including the multiple acoustic wave devices 1b is cut with a dicing machine to obtain the multiple acoustic wave devices 1b (chips).

The method of manufacturing the acoustic wave device 1b is an example and is not particularly limited. For example, the piezoelectric layer 4 may be formed using a film formation technique. In the case above, the method of manufacturing the acoustic wave device 1b includes a process of forming the piezoelectric layer 4 instead of the second process and the third process. The piezoelectric layer 4 formed by the film formation technique may be a single-crystal or a twin-crystal, for example. The film formation technique is a CVD method, for example, but is not limited thereto. Further, the piezoelectric layer 4 is subjected to poling treatment.

(4) Effect

The acoustic wave device 1b according to Preferred Embodiment 2 uses a thickness shear primary mode bulk wave, the same as the acoustic wave device 1 according to Preferred Embodiment 1. With this, in the acoustic wave device 1b according to Preferred Embodiment 2, the resonant frequency is not restricted by the distance between the center lines of the first electrode 51 and the second electrode 52 defining a pair, but the resonant frequency may be made higher by reducing the thickness of the piezoelectric layer 4. This makes it possible to handle a higher frequency without increasing the planar size of the acoustic wave device 1b.

In the acoustic wave device 1b according to Preferred Embodiment 2, since the second main surface 42 of the piezoelectric layer 4 is constrained by the acoustic reflection layer 3 in the acoustic wave resonator 5, it is possible to suppress an unnecessary wave. Further, in the acoustic wave device 1b according to Preferred Embodiment 2, the material of the piezoelectric layer 4 is $LiNbO_3$ or $LiTaO_3$, and the material of the low acoustic impedance layer 31 is silicon oxide. Here, the frequency-temperature characteristics of each of $LiNbO_3$ and $LiTaO_3$ have a negative slope, and the frequency-temperature characteristics of silicon oxide have a positive slope. Accordingly, in the acoustic wave device 1b according to Preferred Embodiment 2, the absolute value of TCF (Temperature Coefficient of Frequency) may be made smaller, and frequency-temperature characteristics may be improved.

The acoustic wave device 1b according to Preferred Embodiment 2 includes the acoustic reflection layer 3 provided between the support substrate 2 and the piezoelectric layer 4.

Modification 1 of Preferred Embodiment 2

In the acoustic wave device 1b according to Preferred Embodiment 2, the acoustic reflection layer 3 is shared by the multiple acoustic wave resonators 5. However, of the multiple high acoustic impedance layers 32, the high acoustic impedance layer 32 (second high acoustic impedance layer 322) closest to the piezoelectric layer 4 may be separated for each acoustic wave resonator 5.

Modification 2 of Preferred Embodiment 2

Figure 20:
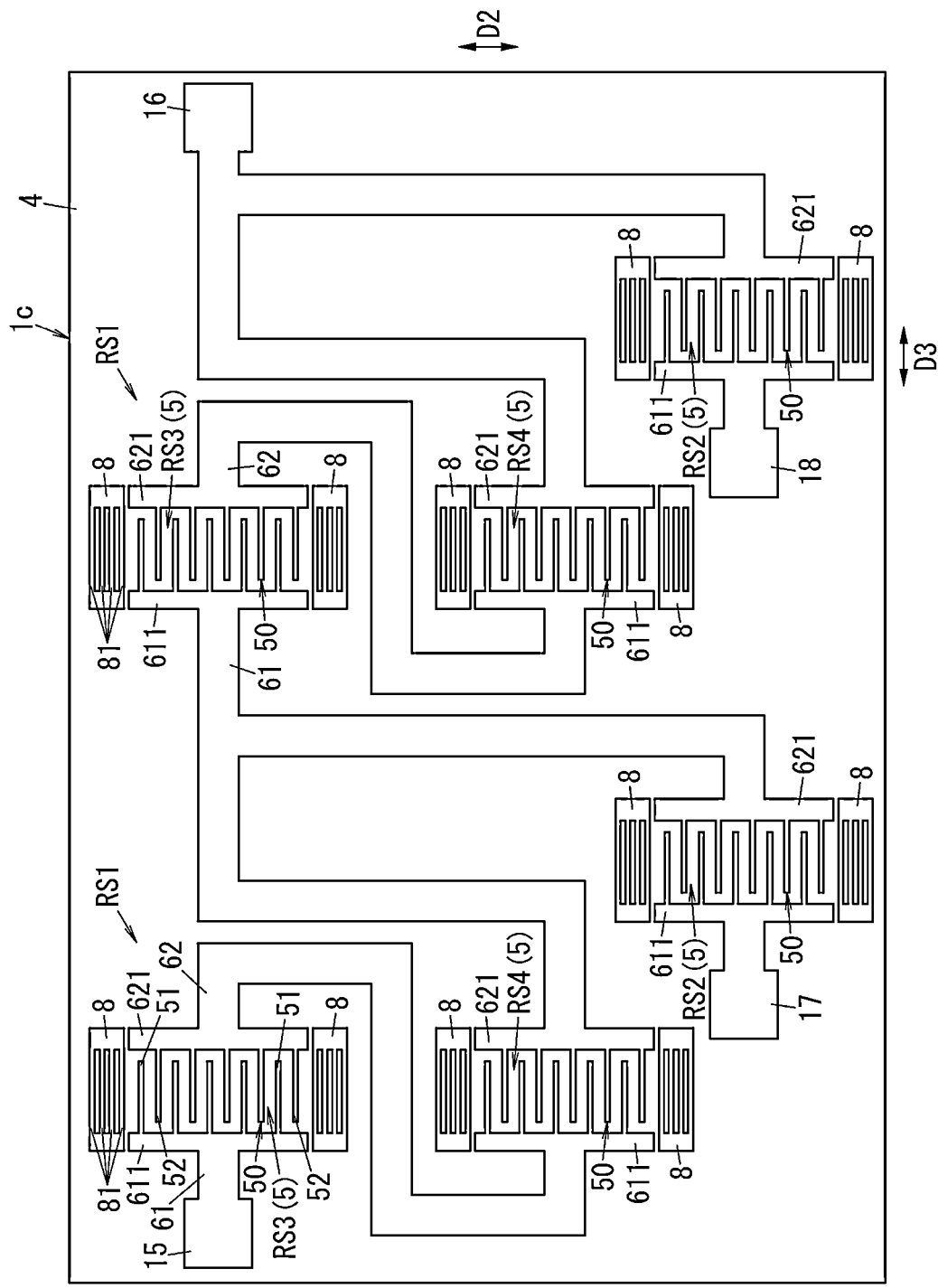
FIG. 20 is a plan view of an acoustic wave device according to Modification 2 of Preferred Embodiment 2 of the present invention.

Hereinafter, an acoustic wave device 1c according to Modification 2 of Preferred Embodiment 2 will be described with reference to FIG. 20. With respect to the acoustic wave device 1c according to Modification 2, the same elements as those of the acoustic wave device 1b according to Preferred Embodiment 2 are denoted by the same reference signs, and a description thereof will be omitted.

The acoustic wave device 1c according to Modification 2 of Preferred Embodiment 2 differs from the acoustic wave device 1b according to Preferred Embodiment 2 in that each of the multiple acoustic wave resonators 5 further includes two reflectors 8. The configuration of each reflector 8 is the same as that of each reflector 8 of the acoustic wave device 1a according to Modification 1 of Preferred Embodiment 1.

As another modification of Preferred Embodiment 2, the series-arm resonator RS1 and the parallel-arm resonator RS2 may overlap with the same cavity 26 in a plan view, the same as in Modification 4 of Preferred Embodiment 1. Otherwise, as in Modification 5 of Preferred Embodiment 1, the first divided resonator RS3 and the second divided resonator RS4 may have a configuration as follows. The second busbar 621 of the pair of busbars (first busbar 611 and second busbar 621) included in the first divided resonator RS3, and the first busbar 611 of the pair of busbars (first busbar 611 and second busbar 621) included in the second divided resonator RS4 may be the shared inter-stage busbar 63.

The above-described Preferred Embodiment 1, Preferred Embodiment 2, or the like is merely one of various preferred embodiments of the present invention. The above-described Preferred Embodiment 1, Preferred Embodiment 2, or the like may be modified in various ways depending on such as design as long as one or more of the advantages of various preferred embodiments of the present invention is achieved.

For example, in the acoustic wave device 1 according to Preferred Embodiment 1, the piezoelectric layer 4 is bonded to the support substrate 2 via the silicon oxide film 7, but the silicon oxide film 7 is not an essential element.

Further, in the acoustic wave device 1 according to Preferred Embodiment 1, the cavity 26 is formed to penetrate through the support substrate 2 in the thickness direction thereof, but is not limited thereto. The cavity 26 may be include an internal space in a recessed portion on the first main surface 21 of the support substrate 2 without penetrating through the support substrate 2.

In the acoustic wave devices 1 to 1c, the sectional shape of the first electrode 51 and the second electrode 52 is a rectangular shape, but is not limited thereto. Here, the sectional shape is the shape of a section orthogonal to the thickness direction D1 and the second direction D2 of the piezoelectric layer 4, for example. The first electrode 51 and the second electrode 52 may have a shape in which the width of the lower end is wider than the width of the upper end as in any of FIGS. 21A to 21D, for example. With this, it is possible to increase capacitance between the first electrode 51 and second electrode 52 defining a pair without increasing the widths of the first main surface 511 (see FIG. 7) of the first electrode 51 and the first main surface 521 (see FIG. 7) of the second electrode 52.

Figure 21A:
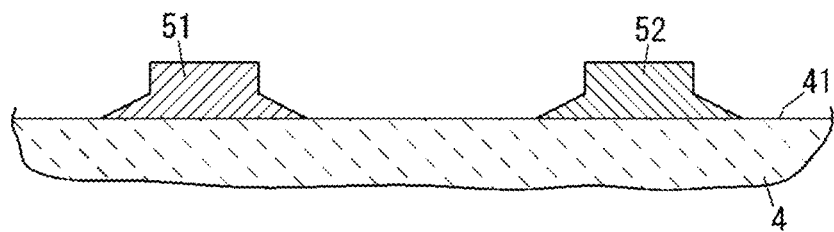
FIGS. 21A to 21D are sectional views illustrating other shapes of a pair of electrodes of the acoustic wave device.
Figure 21B:
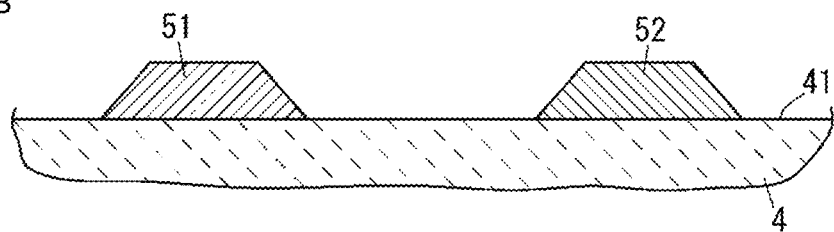
Figure 21C:
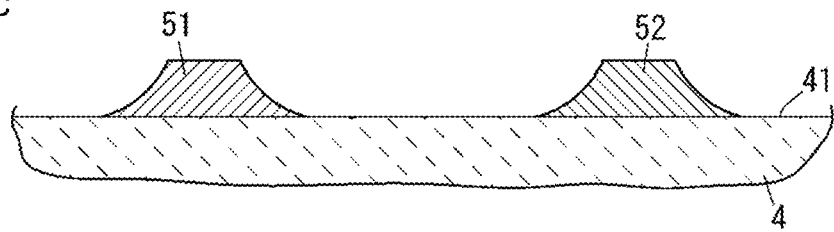
Figure 21D:
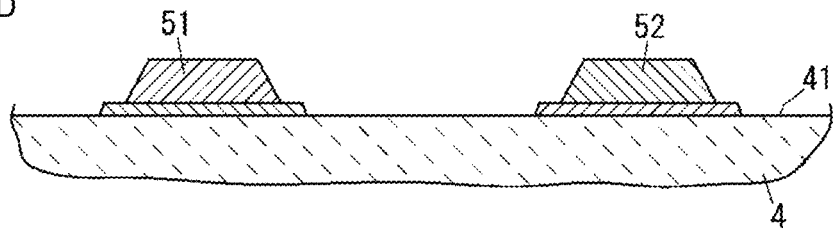

The first electrode 51 and the second electrode 52 in FIG. 21A have a portion with a substantially constant width on the upper end side and a portion with a gradually increasing width on the lower end side. Further, the first electrode 51 and the second electrode 52 in FIG. 21B have a trapezoidal shape in section. Furthermore, the first electrode 51 and the second electrode 52 in FIG. 21C have a shape spreading toward the lower end, and both side surfaces in the width direction are curved surfaces. Still further, the first electrode 51 and the second electrode 52 in FIG. 21D have a portion having a trapezoidal section on the upper end side and a portion having another trapezoidal section on the lower end side. The portion on the lower end side is wider than the portion on the upper end side.

Figure 22A:
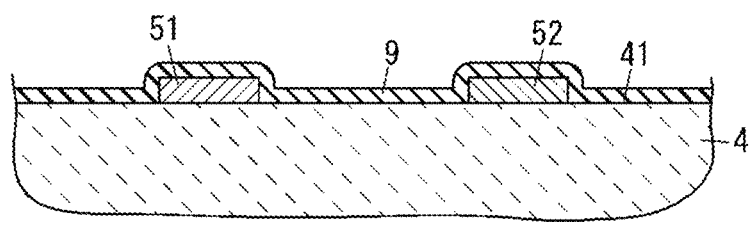
FIGS. 22A to 22C are sectional views illustrating other configuration examples of the acoustic wave device.
Figure 22B:
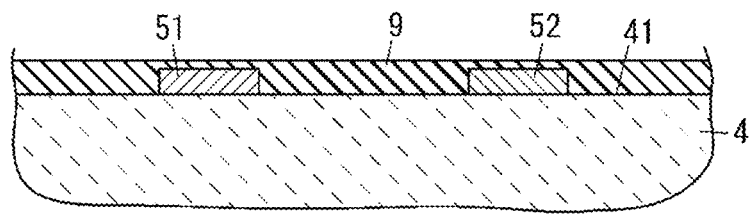
Figure 22C:
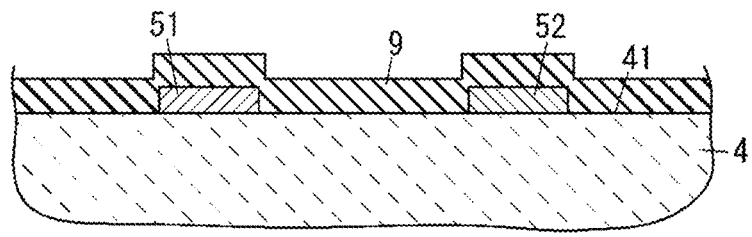

The acoustic wave devices 1 to 1c may include a dielectric film 9 covering the first main surface 41 of the piezoelectric layer 4 and the first electrode 51 and the second electrode 52 on the first main surface 41, as in any of FIGS. 22A to 22C. In the acoustic wave devices 1 to 1c, by including the dielectric film 9, the capacitance between the first electrode 51 and the second electrode 52 defining a pair may be increased. In FIG. 22A, the thickness of the dielectric film 9 is thinner than the thickness of the first electrode 51 and the second electrode 52, and the surface of the dielectric film 9 has an uneven shape following the shape of the base. In FIG. 22B, the surface of the dielectric film 9 is flattened to be a planar shape. In FIG. 22C, the thickness of the dielectric film 9 is thicker than the thickness of the first electrode 51 and the second electrode 52, and the surface of the dielectric film 9 has an uneven shape following the shape of the base.

In the acoustic wave devices 1 to 1c, the sectional shape of the first electrode 51 and the sectional shape of the second electrode 52 may be different from each other. Here, the sectional shape is the shape of a section orthogonal to the thickness direction D1 and the second direction D2 of the piezoelectric layer 4, for example.

In the acoustic wave devices 1 to 1c, the acoustic wave resonator 5 includes the multiple first electrodes 51 and the multiple second electrodes 52, but not limited thereto. It is sufficient that the acoustic wave resonator 5 includes at least a pair of electrodes (first electrode 51 and second electrode 52).

In the acoustic wave devices 1 to 1c, the shape of the first electrode 51 and the second electrode 52 of one acoustic wave resonator 5 may be different from the shape of the first electrode 51 and the second electrode 52 of another acoustic wave resonator 5. Further, the shape of the first electrode 51 and the second electrode 52 of the acoustic wave resonator 5 of the series-arm resonator RS1 and the shape of the first electrode 51 and the second electrode 52 of the acoustic wave resonator 5 of the parallel-arm resonator RS2 may be different from each other.

Furthermore, the first electrode 51 and the second electrode 52 are not limited to being linear in a plan view from the thickness direction D1 of the piezoelectric layer 4. For example, the first electrode 51 and the second electrode 52 may have a curved shape or a shape including a linear portion and a curved portion.

Aspects

The present description discloses the following aspects.

Acoustic wave devices (1 to 1c) according to a first aspect include a piezoelectric layer (4), a first electrode (51), and a second electrode (52). The first electrode (51) and the second electrode (52) face each other in a direction (longitudinal direction D2) intersecting with a thickness direction (D1) of the piezoelectric layer (4). The acoustic wave devices (1 to 1c) use a thickness shear primary mode bulk wave. The material of the piezoelectric layer (4) is lithium niobate or lithium tantalate. The acoustic wave devices (1 to 1c) include the multiple electrode portions (50), each including the first electrode (51) and the second electrode (52). The acoustic wave devices (1 to 1c) further include a first divided resonator (RS3), a second divided resonator (RS4), and a support substrate (2). The first divided resonator (RS3) and the second divided resonator (RS4) are connected in series without another resonator being connected therebetween, or are connected in parallel with each other to the same connection node on a path (first path 12) connecting an input terminal (15) and an output terminal (16). The support substrate (2) includes a first main surface (21) and a second main surface (22) opposed to each other. The first divided resonator (RS3) includes a first installation portion (401). The first installation portion (401) includes a first electrode portion (501) of multiple electrode portions (50) and a first region (451) of the piezoelectric layer (4). The first region (451) is provided with the first electrode portion (501). The second divided resonator (RS4) includes a second installation portion (402). The second installation portion (402) includes a second electrode portion (502) of the multiple electrode portions (50) and a second region (452) of the piezoelectric layer (4). The second region (452) is provided with the second electrode portion (502). The piezoelectric layer (4) is directly or indirectly provided on the support substrate (2). The support substrate (2) includes a first energy confinement layer (a first cavity 26a and a first acoustic reflection layer 3a) and a second energy confinement layer (a second cavity 26b and a second acoustic reflection layer 3b). The first energy confinement layer at least partially overlaps with the first region (451) of the piezoelectric layer (4). The second energy confinement layer at least partially overlaps with the second region (452) of the piezoelectric layer (4). The first energy confinement layer and the second energy confinement layer are integrally provided in the support substrate (2).

With the use of the acoustic wave devices (1 to 1c) according to the first aspect, the Q factor may be increased even when the size is further reduced, and it is possible to further reduce the size when the first divided resonator (RS3) and the second divided resonator (RS4) are formed.

The acoustic wave devices (1 to 1c) according to a second aspect include the piezoelectric layer (4), the first electrode (51), and the second electrode (52). The first electrode (51) and the second electrode (52) face each other in the direction (second direction D2) intersecting with the thickness direction (D1) of the piezoelectric layer (4). The first electrode (51) and the second electrode (52) are adjacent to each other. In any section along the thickness direction (D1) of the piezoelectric layer (4), when the distance between the center lines of the first electrode (51) and the second electrode (52) is denoted as p, and the thickness of the piezoelectric layer (4) is denoted as d, d/p is about 0.5 or less. The material of the piezoelectric layer (4) is lithium niobate or lithium tantalate. The acoustic wave devices (1 to 1c) include the multiple electrode portions (50), each including the first electrode (51) and the second electrode (52). The acoustic wave devices (1 to 1c) further include the first divided resonator (RS3), the second divided resonator (RS4), and the support substrate (2). The first divided resonator (RS3) and the second divided resonator (RS4) are connected in series without another resonator being connected therebetween, or are connected in parallel with each other to the same connection node on the path (first path 12) connecting the input terminal (15) and the output terminal (16). The support substrate (2) has the first main surface (21) and the second main surface (22) opposed to each other. The first divided resonator (RS3) includes the first installation portion (401). The first installation portion (401) includes the first electrode portion (501) of the multiple electrode portions (50) and the first region (451) of the piezoelectric layer (4). The first region (451) is provided with the first electrode portion (501). The second divided resonator (RS4) includes the second installation portion (402). The second installation portion (402) includes the second electrode portion (502) of the multiple electrode portions (50) and the second region (452) of the piezoelectric layer (4). The second region (452) is provided with the second electrode portion (502). The piezoelectric layer (4) is directly or indirectly provided on the support substrate (2). The support substrate (2) includes the first energy confinement layer (a first cavity 26a, and a first acoustic reflection layer 3a) and the second energy confinement layer (a second cavity 26b, and a second acoustic reflection layer 3b). The first energy confinement layer at least partially exposes the first region (451) of the piezoelectric layer (4). The second energy confinement layer at least partially exposes the second region (452) of the piezoelectric layer (4). The first energy confinement layer and the second energy confinement layer are integrally provided in the support substrate (2).

With the use of the acoustic wave devices (1 to 1c) according to the second aspect, the Q factor may be increased even when the size is further reduced, and it is possible to further reduce the size when the first divided resonator (RS3) and the second divided resonator (RS4) are formed.

In the acoustic wave devices (1 to 1c) according to a third aspect, a thickness (d1) of the first divided resonator (RS3) is the thickness of the first installation portion (401), in the first or second aspect. The thickness of the second divided resonator (RS4) is the thickness of the second installation portion (402). The thickness (d1) of the first divided resonator (RS3) and a thickness (d2) of the second divided resonator (RS4) are different from each other.

With the use of the acoustic wave devices (1 to 1c) according to the third aspect, ripples may be dispersed.

In the acoustic wave devices (1 to 1c) according to a fourth aspect, the polarity of the first divided resonator (RS3) and the polarity of the second divided resonator (RS4) are different from each other, in any one of the first to third aspects.

With the use of the acoustic wave devices (1 to 1c) according to the fourth aspect, linearity may further be improved.

In the acoustic wave devices (1b; 1c) according to a fifth aspect, at least one of the first energy confinement layer and the second energy confinement layer is an acoustic reflection layer (3), in any one of the first to fourth aspects. The acoustic reflection layer (3) has a high acoustic impedance layer (32) and a low acoustic impedance layer (31). The acoustic impedance of the low acoustic impedance layer (31) is lower than that of the high acoustic impedance layer (32).

With the use of the acoustic wave devices (1b; 1c) according to the fifth aspect, the linearity may further be improved.

In the acoustic wave devices (1;1a) according to a sixth aspect, the first energy confinement layer and the second energy confinement layer are a cavity (26), in any one of the first to fourth aspects.

In the acoustic wave devices (1 to 1c) according to a seventh aspect, a distance (p) between the center lines in the first divided resonator (RS3) and a distance (p) between the center lines in the second divided resonator (RS4) are different from each other, in the second aspect.

With the use of the acoustic wave devices (1 to 1c) according to the seventh aspect, the ripples may be dispersed without affecting the main resonance.

In the acoustic wave devices (1 to 1c) according to an eighth aspect, d/p is about 0.24 or less, in the second aspect.

With the use of the acoustic wave devices (1 to 1c) according to the eighth aspect, it is possible to make a fractional bandwidth still larger.

In the acoustic wave devices (1 to 1c) according to a ninth aspect, the first electrode (51) and the second electrode (52) are adjacent to each other, in the eighth aspect. The first electrode (51) has a first electrode main portion (510). The first electrode main portion (510) overlaps with the second electrode (52) in the direction (longitudinal direction D2) in which the first electrode (51) and the second electrode (52) face each other. The second electrode (52) has a second electrode main portion (520). The second electrode main portion (520) overlaps with the first electrode (51) in the direction (longitudinal direction D2) in which the first electrode (51) and the second electrode (52) face each other. The piezoelectric layer (4) has a defined region (45). In a plan view from the thickness direction (D1) of the piezoelectric layer (4), the defined region (45) overlaps with both of the first electrode (51) and the second electrode (52) in the direction (longitudinal direction D2) in which the first electrode (51) and the second electrode (52) face each other in the piezoelectric layer (4), and is positioned between the first electrode (51) and the second electrode (52). In a plan view from the thickness direction (D1) of the piezoelectric layer (4), when the area of the first electrode main portion (510) is denoted as S1, the area of the second electrode main portion (520) is denoted as S2, and the area of the defined region (45) is denoted as S0, and a structural parameter defined by (S1+S2)/(S1+S2+S0) is denoted as MR, the acoustic wave devices (1 to 1c) satisfy the condition MR about 1.75×(d/p)+0.075.

With the use of the acoustic wave devices (1 to 1c) according to the ninth aspect, it is possible to suppress spurious components in a band.

In the acoustic wave devices (1 to 1c) according to a tenth aspect, each of the first electrode (51) and the second electrode (52) is the electrode to have hot electric potential or ground electric potential, in any one of the first to ninth aspects.

With the use of the acoustic wave devices (1 to 1c) according to the tenth aspect, it is possible to prevent the first electrode (51) and the second electrode (52) defining a pair from taking floating electric potential.

In the acoustic wave devices (1 to 1c) according to an eleventh aspect, in a plan view from the thickness direction (D1), the first energy confinement layer (first cavity 26a; first acoustic reflection layer 3a) overlaps with the first electrode (51) and the second electrode (52) of the first electrode portion (501), and a portion of the piezoelectric layer (4) between the first electrode (51) and the second electrode (52) of the first electrode portion (501), in any one of the first to tenth aspects. In a plan view from the thickness direction (D1), the second energy confinement layer (a second cavity 26b, and a second acoustic reflection layer 3b) overlaps with the first electrode (51) and the second electrode (52) of the second electrode portion (502), and a portion of the piezoelectric layer (4) between the first electrode (51) and the second electrode (52) of the second electrode portion (502).

In the acoustic wave devices (1 to 1c) according to a twelfth aspect, the first electrode (51) and the second electrode (52) face each other on the same main surface (a first main surface 41, and a second main surface 42) of the piezoelectric layer (4), in any one of the first to eleventh aspects.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device configured to use a thickness shear primary mode bulk wave, the acoustic wave device comprising:
   a piezoelectric layer; and
   a first electrode and a second electrode facing each other in a direction intersecting with a thickness direction of the piezoelectric layer; wherein
   a material of the piezoelectric layer is lithium niobate or lithium tantalate;
   multiple electrode portions including the first electrode and the second electrode are provided;
   a first divided resonator and a second divided resonator connected in series without another resonator being connected between the first divided resonator and the second divided resonator, or connected in parallel with each other to a same connection node on a path connecting an input terminal and an output terminal;
   a support substrate including a first main surface and a second main surface opposed to each other are provided;
   the first divided resonator includes a first electrode portion of the multiple electrode portions and a first installation portion of the piezoelectric layer including a first region in which the first electrode portion is provided;
   the second divided resonator includes a second electrode portion of the multiple electrode portions and a second installation portion of the piezoelectric layer including a second region in which the second electrode portion is provided;
   the piezoelectric layer is directly or indirectly provided on the support substrate;
   the support substrate includes:
      a first energy confinement layer at least partially overlapping with the first region of the piezoelectric layer in a plan view from the thickness direction of the piezoelectric layer; and
      a second energy confinement layer at least partially overlapping with the second region of the piezoelectric layer in a plan view from the thickness direction of the piezoelectric layer; and
   the first energy confinement layer and the second energy confinement layer are integrally provided with each other in the support substrate.

2. The acoustic wave device according to claim 1, wherein
a thickness of the first divided resonator is a thickness of the first installation portion;
a thickness of the second divided resonator is a thickness of the second installation portion; and
the thickness of the first divided resonator and the thickness of the second divided resonator are different from each other.

3. The acoustic wave device according to claim 1, wherein a polarity of the first divided resonator and a polarity of the second divided resonator are different from each other.

4. The acoustic wave device according to claim 1, wherein
the first energy confinement layer and the second energy confinement layer are acoustic reflection layers;
the acoustic reflection layer includes:
a high acoustic impedance layer; and
a low acoustic impedance layer having an acoustic impedance lower than an acoustic impedance of the high acoustic impedance layer.

5. The acoustic wave device according to claim 1, wherein the first energy confinement layer and the second energy confinement layer include a cavity.

6. The acoustic wave device according to claim 1, wherein each of the first electrode and the second electrode is an electrode to have hot electric potential or ground electric potential.

7. The acoustic wave device according to claim 1, wherein
the first energy confinement layer overlaps with the first electrode and the second electrode of the first electrode portion, and a portion of the piezoelectric layer between the first electrode and the second electrode of the first electrode portion, in a plan view from the thickness direction; and
the second energy confinement layer overlaps with the first electrode and the second electrode of the second electrode portion, and a portion of the piezoelectric layer between the first electrode and the second electrode of the second electrode portion, in a plan view from the thickness direction.

8. The acoustic wave device according to claim 1, wherein the first electrode and the second electrode face each other on a same main surface of the piezoelectric layer.

9. An acoustic wave device, comprising:
a piezoelectric layer; and
a first electrode and a second electrode facing each other in a direction intersecting with a thickness direction of the piezoelectric layer; wherein
the first electrode and the second electrode are adjacent to each other;
d/p is about 0.5 or less in any section along the thickness direction of the piezoelectric layer with a distance between center lines of the first electrode and the second electrode denoted as p, and a thickness of the piezoelectric layer denoted as d;
a material of the piezoelectric layer is lithium niobate or lithium tantalate;
multiple electrode portions including the first electrode and the second electrode are provided;
a first divided resonator and a second divided resonator connected in series without another resonator being connected between the first divided resonator and the second divided resonator, or connected in parallel with each other to a same connection node on a path connecting an input terminal and an output terminal;
a support substrate including a first main surface and a second main surface opposed to each other are provided;
the first divided resonator includes a first electrode portion of the multiple electrode portions and a first installation portion of the piezoelectric layer including a first region in which the first electrode portion is provided;
the second divided resonator includes a second electrode portion of the multiple electrode portions and a second installation portion of the piezoelectric layer including a second region in which the second electrode portion is provided;
the piezoelectric layer is directly or indirectly provided on the support substrate;
the support substrate includes:
a first energy confinement layer at least partially overlapping with the first region of the piezoelectric layer in a plan view from the thickness direction of the piezoelectric layer; and
a second energy confinement layer at least partially overlapping with the second region of the piezoelectric layer in a plan view from the thickness direction of the piezoelectric layer; and
the first energy confinement layer and the second energy confinement layer are integrally provided with each other in the support substrate.

10. The acoustic wave device according to claim 9, wherein a thickness of the first divided resonator is a thickness of the first installation portion;
a thickness of the second divided resonator is a thickness of the second installation portion; and
the thickness of the first divided resonator and the thickness of the second divided resonator are different from each other.

11. The acoustic wave device according to claim 9, wherein a polarity of the first divided resonator and a polarity of the second divided resonator are different from each other.

12. The acoustic wave device according to claim 9, wherein
the first energy confinement layer and the second energy confinement layer are acoustic reflection layers;
the acoustic reflection layer includes:
a high acoustic impedance layer; and
a low acoustic impedance layer having an acoustic impedance lower than an acoustic impedance of the high acoustic impedance layer.

13. The acoustic wave device according to claim 9, wherein the first energy confinement layer and the second energy confinement layer include a cavity.

14. The acoustic wave device according to claim 9, wherein a distance between center lines in the first divided resonator and a distance between center lines in the second divided resonator are different from each other.

15. The acoustic wave device according to claim 9, wherein the d/p is about 0.24 or less.

16. The acoustic wave device according to claim 15, wherein
the first electrode and the second electrode are adjacent to each other;
the first electrode includes a first electrode main portion overlapping with the second electrode in a direction in which the first electrode and the second electrode face each other;
the second electrode includes a second electrode main portion overlapping with the first electrode in the direction in which the first electrode and the second electrode face each other;
the piezoelectric layer has a defined region in the piezoelectric layer that overlaps with both of the first electrode and the second electrode in the direction in which the first electrode and the second electrode face each other, and is positioned between the first electrode and the second electrode, in a plan view from a thickness direction of the piezoelectric layer; and in a plan view from a thickness direction of the piezoelectric layer;
- when an area of the first electrode main portion is denoted as S1;
- an area of the second electrode main portion is denoted as S2;
- an area of the defined region is denoted as S0; and
- a structural parameter defined by (S1+S2)/(S1+S2+S0) is denoted as MR;
- the acoustic wave device satisfies a condition MR≤1.75× (d/p)+0.075.

17. The acoustic wave device according to claim 9, wherein each of the first electrode and the second electrode is an electrode to have hot electric potential or ground electric potential.

18. The acoustic wave device according to claim 9, wherein
- the first energy confinement layer overlaps with the first electrode and the second electrode of the first electrode portion, and a portion of the piezoelectric layer between the first electrode and the second electrode of the first electrode portion, in a plan view from the thickness direction; and
- the second energy confinement layer overlaps with the first electrode and the second electrode of the second electrode portion, and a portion of the piezoelectric layer between the first electrode and the second electrode of the second electrode portion, in a plan view from the thickness direction.

19. The acoustic wave device according to claim 9, wherein the first electrode and the second electrode face each other on a same main surface of the piezoelectric layer.

* * * * *